United States Patent
Trifonov et al.

(10) Patent No.: US 7,511,648 B2
(45) Date of Patent: Mar. 31, 2009

(54) INTEGRATING/SAR ADC AND METHOD WITH LOW INTEGRATOR SWING AND LOW COMPLEXITY

(75) Inventors: Dimitar T. Trifonov, Vail, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/072,968

(22) Filed: Feb. 29, 2008

(65) Prior Publication Data
US 2008/0258959 A1   Oct. 23, 2008

Related U.S. Application Data

(63) Continuation-in-part of application No. 11/738,566, filed on Apr. 23, 2007.

(51) Int. Cl.
  *H03M 3/00* (2006.01)
(52) U.S. Cl. .............. 341/143; 341/118; 341/122; 341/155; 341/161; 341/172
(58) Field of Classification Search .......... 341/118, 341/120, 143, 155, 156, 161, 172
See application file for complete search history.

(56) References Cited

U.S. PATENT DOCUMENTS

| | | | | |
|---|---|---|---|---|
| 5,349,352 A | * | 9/1994 | Saleh | 341/143 |
| 5,644,308 A | * | 7/1997 | Kerth et al. | 341/120 |
| 6,249,236 B1 | * | 6/2001 | Lee et al. | 341/143 |
| 6,844,840 B1 | * | 1/2005 | Melanson | 341/161 |
| 6,847,321 B1 | * | 1/2005 | Pentakota et al. | 341/156 |
| 6,940,438 B2 | * | 9/2005 | Koe et al. | 341/143 |
| 6,958,722 B1 | * | 10/2005 | Janakiraman et al. | 341/161 |
| 6,970,118 B2 | * | 11/2005 | Regier | 341/118 |
| 6,970,126 B1 | * | 11/2005 | O'Dowd et al. | 341/172 |
| 7,061,421 B1 | * | 6/2006 | Xiao et al. | 341/155 |
| 2005/0140538 A1 | * | 6/2005 | A | 341/163 |
| 2006/0001563 A1 | * | 1/2006 | Kearney | 341/155 |
| 2007/0236380 A1 | * | 10/2007 | La Rue et al. | 341/155 |

OTHER PUBLICATIONS

U.S. Appl. No. 11/738,566, filed Apr. 23, 2007.

* cited by examiner

*Primary Examiner*—Linh V Nguyen
(74) *Attorney, Agent, or Firm*—John J. Patti; Wade J. Brady, III; Frederick J. Telecky, Jr.

(57) ABSTRACT

A reconfigurable circuit (10) includes an integrator (30) having switches (SW1-6) for selectively coupling input capacitors (C0,1,2,3,6,7) and integrating capacitors (C4,5) to terminals of the integrator (30) for operation of a hybrid delta-sigma/SAR ADC (400) so as to create a reference voltage value (Vref) equal to the sum of a first voltage ($\Delta Vbe$) and a second voltage (Vbe). A first integration is performed to reduce the integrator output voltage swing. A residue (Vresidue) of the integrator is multiplied by 2. Then the second voltage (Vbe) is integrated in a first direction if a comparator (22) coupled to the integrator changes state or in an opposite direction if the comparator does not change state. The first voltage ($\Delta Vbe$) is integrated in a direction that causes the integrator output voltage (Vout) to equal either $2 \times Vresidue - Vref$ or $2 \times Vresidue + Vref$.

21 Claims, 11 Drawing Sheets

INTEGRATING/SAR ADC AND METHOD WITH LOW INTEGRATOR SWING AND LOW COMPLEXITY

CROSS REFERENCE TO RELATED APPLICATION

This application is a continuation-in-part of commonly assigned patent application Ser. No. 11/738,566 entitled "Hybrid Delta-Sigma/SAR Analog to Digital Converter and Methods for Using Such", filed Apr. 23, 2007 by Jerry Doorenbos, Marco Gardner and Dimitar Trifonov, and incorporated herein by reference.

BACKGROUND OF THE INVENTION

The present invention relates generally to hybrid delta-sigma/SAR analog to digital converters (ADCs) of the type described in above-mentioned commonly assigned patent application Ser. No. 11/738,566. More particularly, the present invention relates to improvements which provide minimum integrator output swing, operation with very low power supply voltage, reduced quiescent current, and high accuracy even though the integrated circuit hybrid delta-sigma/SAR ADC is fabricated using low voltage "leaky" manufacturing processes.

Various analog to digital data converters and conversion techniques have been developed over the years for converting electrical signals from an analog domain to a digital domain. In general, the process of analog to digital conversion includes sampling an analog signal and comparing the sampled analog signal to a threshold value. A binary result is recorded depending upon the result of the comparison. The process of comparing the sample against a threshold may be repeated a number of times with each successive comparison using a different threshold and residue of the sample. The number of iterations typically affects the noise level of any result as well as the resolution of the ultimate digital signal.

Some analog to digital converters rely on delta-sigma modulation techniques. FIG. 1A is a conceptual diagram of a first order delta-sigma analog to digital converter 100. Analog to digital converter 100 includes an operational amplifier 110, a comparator 120, and a counter 130. A positive input of operational amplifier 110 is electrically coupled to ground. A negative input of operational amplifier 110 is electrically coupled to a reference sample capacitor 156 and an input sample capacitor 166. Reference sample capacitor 156 is electrically coupled to a negative version of a voltage reference 150 via a switch 152, and to ground via a switch 154. Input sample capacitor 166 is electrically coupled to a voltage input 160 via a switch 162 and to ground via a switch 164. An integrating capacitor 116 is electrically coupled between the output and the negative input of operational amplifier 110 by way of a switch 114. Another switch 112 allows for shorting the output of operational amplifier 110 to the negative input thereof.

In operation, voltage input 160 is sampled by closing switch 162 and switch 112. This allows input sample capacitor 166 to be charged to a level reflecting voltage input 160. The charge from input sample capacitor 166 is then transferred to integrating capacitor 116 by opening switch 162 and switch 112, and closing switch 114 and switch 164. This results in an output from operational amplifier 110 at the input of comparator 120. If the gain of operational amplifier 110 is unity, the output is approximately equal to voltage input 160. The output is compared with voltage reference 150. If the result is a logic '0', counter 130 is not incremented. In the next pass, voltage input 160 is again sampled by closing switch 162 and switch 112. Once charging is complete, charge is transferred from capacitor 166 to capacitor 116 by closing switch 114 and switch 164. This results in a value of approximately double voltage input 160 at the output of operational amplifier 110. Again, if the result is a logic '0', counter 130 is not incremented and substantially the same process is repeated until the result of a logic '1' is achieved.

Alternatively, on any pass wherein the result of the comparison is a logic '1', counter 130 is incremented. Further, if the result is a logic '1', the negative version of the voltage reference 150 is sampled along with voltage input 160 on the next pass. This is done by closing switch 152, switch 162 and switch 112. This causes charge to build up on reference sample capacitor 156 representing the negative reference voltage, and charge to build up on input sample capacitor 166 representing input voltage 160. The charge from both of the aforementioned capacitors is transferred to integrating capacitor 116 by closing switch 114, switch 154 and switch 164. By continually re-sampling input voltage 160 and sampling the negative voltage reference any time a logic '1' is noted, the following residue will remain for a counter value of X and a number of iterations N:

$$\text{Residue}=NV_{in}-XV_{ref}.$$

The digital value representing the voltage input is that maintained on counter 130 at the end of the process. The process may be continued for a large number of iterations which would result in a progressively finer resolution. Unfortunately, the number of samples (N) to create a defined output resolution of ADC result 140 increases exponentially. For example, for a ten bit resolution one thousand, twenty-four ($2^{10}$) samples are required. In comparison, for a twenty bit resolution, over one million samples are required ($2^{20}$). Thus, while analog to digital converter 100 is capable of providing accurate results, results exhibiting relatively high resolution require substantial conversion time.

Other approaches for analog to digital conversion exist. Turning to FIG. 1B, a conceptual diagram of a SAR based analog to digital converter 170 is shown. As shown, SAR based analog to digital converter 170 includes a comparator 175 and a shift register 185 that provides an ADC result 190. In operation, a voltage input 180 is compared with one half of a voltage reference 194. If the voltage input is greater than one half of the voltage reference 194, a logic '1' is shifted into shift register 185. Alternatively, if the voltage input is less than one half of the voltage reference 194, a logic '0' is shifted into shift register 185.

Next, if the previous comparison indicated that voltage input 180 is greater than one half of the voltage reference 194, voltage input 180 is compared with one half of the voltage reference 194 augmented with one quarter of the voltage reference 196 by an adder 172 (i.e., voltage input 180 is compared with three quarters of the voltage reference). Again, where the comparison indicates a greater than condition, a logic '1' is shifted into shift register 185. In contrast, if the comparison indicates a less than condition, a logic '0' is shifted into shift register 185.

Alternatively, if the previous comparison indicated that voltage input 180 is less than one half of the voltage reference 194, voltage input 180 is compared with one half of the voltage reference 194 decremented by one quarter of the voltage reference 196 by adder 172 (i.e., voltage input 180 is compared with one quarter of the voltage reference). Again, if the comparison indicates a greater than condition, a logic '1' is shifted into shift register 185. In contrast, if the comparison indicates a less than condition, a logic '0' is shifted into shift register 185. This process is continued for lower order multiples of the voltage reference. As will be appreciated, the aforementioned process is capable of providing ADC result 190 with a very high resolution in a relatively small amount of time. In particular, only a single iteration is required to produce each bit of resolution. For example, for a ten bit resolution ten iterations are required, and for twenty bits of resolution only twenty iterations are required. However, while analog to digital converter 170 is capable of providing quick results, the results are often inaccurate due to noise.

At high operating temperatures, the previously mentioned "leaky" low voltage integrated circuit manufacturing processes result in relatively high leakage currents. This is a serious limitation for the accuracy of an ADC manufactured using such processes. It requires more complicated switches as additional switching modes are introduced. Unfortunately, mixed or hybrid delta-sigma/SAR ADC architectures require more complex switching than ADCs including only delta-sigma architecture or including only SAR architecture.

A serious problem of the hybrid delta-sigma/SAR ADC as described in above mentioned commonly assigned patent application Ser. No. 11/738,566 is the amount of output voltage swing required at the output of the integrator when the hybrid delta-sigma/SAR is operating in its SAR mode. The algorithm for SAR operation using two comparators and a single cycle per SAR bit is:

```
If (Vresidue > +Vthreshold) Then
    Vout = 2*(Vresidue – Vref)
Else If (Vresidue < –Vthreshold) Then
    Vout = 2*(Vresidue + Vref)
Else
    Vout = 2*(Vresidue)
End If
```

A different algorithm for use with a single comparator and two cycles per SAR bit is:

Cycle 1

```
If (Vresidue > 0) then
    Vout1 = 2*(Vresidue – Vref)
Else
    Vout1 = 2*(Vresidue)
End If
```

Cycle 2

$V\text{out2}=(V\text{out1}+V\text{ref})$

In the foregoing case, Vresidue is the integrator output voltage from the last integration cycle or the previous SAR cycle, Vref is the reference voltage, Vout is the resulting output of the integrator and Vthreshold is the comparator threshold. From the two foregoing algorithms it is clear that for implementation of the algorithm using a single comparator the output swing of the integrator is significantly greater during the SAR mode of operation, due to the multiplication by two and due to the adding or subtracting of a full reference.

The necessary output voltage swing results in an undesirable limitation on the minimum power supply voltage at which the hybrid delta-sigma/SAR can operate. The necessary output voltage swing can be reduced by increasing the number of integration capacitors, but that has the undesired effect of increasing the amount of required integrated circuit chip area and either increasing the quiescent current required in the integrator or having an accordingly longer settling time needed every half cycle for the integrator output voltage to settle to the necessary value with the necessary accuracy.

The conventional method for SAR operation, as described in above mentioned parent patent application Ser. No. 11/738, 566, is to perform simultaneous amplification of the residue of the integrator and sampling of the reference. This can achieve one bit resolution in one cycle, but requires additional capacitors to perform the multiplication as the ones used to sample the reference are busy.

Thus, there is an unmet need for a circuit and method which provides a hybrid delta-sigma/SAR ADC which is capable of operation from a reduced power supply voltage.

There also is an unmet need for a circuit and method which provides a hybrid delta-sigma/SAR ADC in which the output voltage swing of an integrator therein is reduced without increasing the amount of integrated circuit chip area required.

There also is an unmet need for a circuit and method which provides a hybrid delta-sigma/SAR ADC in which the output voltage swing of an integrator therein is reduced without increasing the number of integration capacitors or increasing the settling time of the integrator output signal.

SUMMARY OF THE INVENTION

It is an object of the invention to provide a circuit and method which provides a hybrid delta-sigma/SAR ADC which is capable of operation from a reduced power supply voltage.

It is another object of the invention to provide a circuit and method which provides a hybrid delta-sigma/SAR ADC in which the output voltage swing of an integrator therein is reduced without increasing the amount of integrated circuit chip area required.

It is another object of the invention to provide a circuit and method which provides a hybrid delta-sigma/SAR ADC in which the output voltage swing of an integrator therein is reduced without increasing the number of integration capacitors or increasing the settling time of the integrator output signal.

It is another object of the invention to provide a circuit and method which provides a complete, very accurate digital temperature sensor on the smallest practical integrated circuit chip, requiring the smallest practical power supply voltage, and requiring lowest amount of quiescent current.

Briefly described, and in accordance with one embodiment, the present invention provides a reconfigurable circuit (10) includes an integrator (30) having switches (SW1-6) for selectively coupling input capacitors (C0,1,2,3,6,7) and integrating capacitors (C4,5) to terminals of the integrator (30) for operation of a hybrid delta-sigma/SAR ADC (400) so as to create a reference voltage value (Vref) equal to the sum of a first voltage ($\Delta$Vbe) and a second voltage (Vbe). A first integration is performed to reduce the integrator output voltage swing. A residue (Vresidue) of the integrator is multiplied by 2. Then the second voltage (Vbe) is integrated in a first direction if a comparator (22) coupled to the integrator changes state or in an opposite second direction if the comparator does not change state. The input voltage ($\Delta$Vbe) is integrated in a direction that causes the integrator output voltage (Vout) to equal either 2×Vresidue−Vref or 2×Vresidue+Vref.

In a described embodiment, the invention provides reconfigurable circuitry (10) in a hybrid delta-sigma/SAR ADC (analog-to-digital) circuit (400) for converting an input voltage ($\Delta$Vbe) to a digital result, the reconfigurable circuitry (10)

including an integrator (30) having an amplifier (15), a plurality of input capacitors (C0,1,2,3,6,7) and first (C4) and second (C5) integrating capacitors, and a plurality of switches (SW1-6) for selectively coupling the plurality of input capacitors (C0,1,2,3,6,7) and the first (C4) and second (C5) integrating capacitors between various terminals of the amplifier (15) and input terminals (11,12) of the integrator (30) to effectuate operation of the hybrid delta-sigma/SAR ADC (400) in delta-sigma ADC and SAR ADC modes thereof. A comparator (22) has an input coupled to an output (Vout) of the integrator (30), an output of the comparator (22) being coupled to MSB/LSB combination logic (470) of the hybrid delta-sigma/SAR ADC circuit (400). Digital control circuitry (28) is coupled to control electrodes of the plurality of switches (SW1-6) for controlling the plurality of switches (SW1-6) by performing a plurality of cycles (Cycles2,3,4) of SAR ADC operation for generating a SAR bit or each of a plurality of SAR bits. The digital control circuitry (28) creates an entire reference voltage value (Vref) equal to the sum of a first voltage ($\Delta$Vbe) and a second voltage (Vbe). A first cycle (Cycle2) includes multiplying a residue voltage (Vresidue) of the integrator (30) by 2, a second cycle (Cycle3) includes integrating the second voltage (Vbe) in a first direction by means of the integrator (30) if the comparator (22) changes state or in a second direction opposite to the first direction if the comparator (22) does not change state, and a third cycle (Cycle4) includes integrating the input voltage ($\Delta$Vbe) in a direction that causes the integrator output voltage (Vout) to equal either 2×Vresidue−Vref or 2×Vresidue+Vref, wherein Vresidue is a residue voltage which is an output voltage of the integrator (30) at the end of a preceding cycle and Vref is equal to the entire reference voltage value ($\Delta$Vbe+Vbe). In a described embodiment, the first voltage is the input voltage ($\Delta$Vbe).

In a described embodiment, the digital control circuitry (28) performs a fourth cycle (Cycle1) before the first (Cycle2), second (Cycle3) and third (Cycle4) cycles, the fourth cycle (Cycle1) including integrating a value of the input voltage ($\Delta$Vbe) in a second direction by means of the integrator (30) so as to substantially reduce a voltage swing of the output (Vout) of the integrator (30). Each of the plurality of switches (SW1-6) is controlled by the digital control circuitry (28). In a described embodiment, the digital control circuitry (28) executes an algorithm represented by Cycle 1:

```
If (Vresidue > 0) ("YES" in block 50 of FIG. 7) then
        If (Vbe > ΔVbe) ("YES" in decision block 51 of FIG. 7) then
                Vout1 = (Vresidue − ΔVbe)
        Else ("NO" in block 51 of FIG. 7)
                Vout1 = (Vresidue − Vbe)
        End If
        State0 = 1 ("YES" in block 50 of FIG. 7)
Else ("NO" in block 50)
        If (Vbe > ΔVbe) ("YES"in decision block 52 of FIG. 7) then
                Vout1 = (Vresidue + ΔVbe)
        Else ("NO" in block 52)
                Vout1 = (Vresidue + Vbe)
        End If
        State0 = 0 ("NO" in block 50 of FIG. 7)
End If
```

Cycle 2:

```
If (Vresidue > 0) ("YES" in blocks 53 to 56 of FIG. 7) then
        State1= 1
```

```
Else ("NO" in blocks 53 to 56 of FIG. 7)
        State1 = 0
End If
Vout2 = 2*(Vresidue)
```

Cycle 3:

```
If (State0 = 1) ("YES" in block 50) then
        If (Vbe > ΔVbe) ("YES" in decision block 51 of FIG. 7) then
                If (State1= 1) ("YES" in block 53 of FIG. 7) then
                        Vout3 = (Vresidue − Vbe)
                Else ("NO" in block 53)
                        Vout3 = (Vresidue + ΔVbe)
                End If
        Else ("NO" in block 51)
                If (State1= 1) ("YES" in block 54) then
                        Vout3 = (Vresidue −ΔVbe)
                Else ("NO" in block 54)
                        Vout3 = (Vresidue + Vbe)
                End If
        End If
Else ("NO" in block 50)
        If (Vbe > ΔVbe) ("YES" in decision block 52 of FIG. 7) then
                If (State1= 1) ("YES" in block 55) then
                        Vout3 = (Vresidue − ΔVbe)
                Else ("NO" in block 55)
                        Vout3 = (Vresidue + Vbe)
                End If
        Else ("NO" in block 52)
                If (State1= 1) ("YES" in block 56) then
                        Vout3 = (Vresidue − Vbe)
                Else ("NO" in block 56)
                        Vout3 = (Vresidue + ΔVbe)
                End If
        End If
End If
```

Cycle 4:

```
If (State0 = 1) ("YES" in block 50) then
        If (Vbe > ΔVbe) ("YES" in decision block 51 of FIG. 7) then
                If (State1= 1) ("YES" in block 53) then
                        Vout4 = (Vresidue + ΔVbe)
                Else ("NO" in block 53)
                        Vout4 = (Vresidue − Vbe)
                End If
        Else ("NO" in block 51)
                If (State1= 1) ("YES" in block 54) then
                        Vout4 = (Vresidue + Vbe)
                Else ("NO" in block 54)
                        Vout4 = (Vresidue −ΔVbe)
                End If
        End If
Else ("NO" in block 50)
        If (Vbe > ΔVbe) ("YES" in decision block 52 of FIG. 7) then
                If (State1= 1) ("YES" in block 55) then
                        Vout4 = (Vresidue + Vbe)
                Else ("NO" in block 55)
                        Vout4 = (Vresidue − ΔVbe)
                End If
        Else ("NO" in block 52)
                If (State1= 1) ("YES" in block 56) then
                        Vout4 = (Vresidue + ΔVbe)
                Else ("NO" in block 56)
                        Vout4 = (Vresidue − Vbe)
                End If
        End If
End If,
``` wherein Vresidue is a residue voltage which is an output voltage of the integrator (30) at the end of a preceding cycle, ΔVbe is the first voltage, Vout1, Vout2, Vout3, and Vout4 are the values of the output (Vout) of the integrator (30) at ends of the fourth (Cycle1), first (Cycle2), second (Cycle3), and third (Cycle4) cycles, respectively, Vbe is the second voltage, and Vref is the entire reference voltage value.

In a described embodiment, the integrator (30) includes first (C0), second (C1), third (C2), fourth (C3), fifth (C6), and sixth (C7) input capacitors, the first (C4) and second (C5) integrating capacitors, and first (SW1), second (SW2), third (SW3), fourth (SW4), fifth (SW5) and sixth (SW6) switches, wherein the first input capacitor (C0) is connected between a first conductor (16) and a pole of the first switch (SW1), the second input capacitor (C1) is connected between a second conductor (18) and a pole of the second switch (SW2), the third input capacitor (C2) is connected between the second conductor (18) and a pole of the fourth switch (SW4), the fourth input capacitor (C3) is connected between the first conductor (16) and a pole of the third switch (SW3), the first conductor (16) is coupled to a pole of the fifth switch (SW5) and a non-inverting input of the amplifier (15), the second conductor (18) is connected to a pole of the sixth switch (SW6) and an inverting input of the amplifier (15), the first integrating capacitor (C4) is connected between a first terminal of the fifth switch (SW5) and a third conductor (17), the second integrating capacitor (C5) is connected between a first terminal of the sixth switch (SW6) and a fourth conductor (20), the third conductor (17) is connected to a second terminal of the fifth switch (SW5), an inverting output of the amplifier (15), an inverting input of the comparator (22), and a first terminal of the fourth switch (SW4), the fourth conductor (20) is connected to a second terminal of the sixth switch (SW6), a non-inverting output of the amplifier (15), a non-inverting input of the comparator (22), and a first terminal of the third switch (SW3), a first terminal of the first switch (SW1) is connected to a first input conductor (11), a second terminal of the first switch (SW1) is connected to a supply voltage (VSS), a first terminal of the second switch (SW2) is connected to a second input conductor (12), a second terminal of the second switch (SW2) is connected to the supply voltage (VSS), the fifth input capacitor (C6) is connected between the second conductor (18) and the second input conductor (12), the sixth input capacitor (C7) is connected between the first conductor (16) and the first input conductor (11), the first input conductor (11) is connected to a second terminal of the third switch (SW3), and the second input conductor (12) is connected to a second terminal of the fourth switch (SW4).

In a described embodiment, the input voltage (ΔVbe) is produced by an input circuit (13) including first (MN0) and second (MN1) transistors and first (I0) and second (I1) variable current sources so as to cause the input voltage (ΔVbe) to represent a temperature of the first (MN0) and second (MN1) transistors, the first transistor (MM0) having an emitter connected to a supply voltage (VSS) and a base and collector connected by a first input conductor (11) to the first variable current source (I0), the second transistor (MN1) having an emitter connected to the supply voltage (VSS) and a base and collector connected by a second input conductor (12) to the second variable current source (I1), the input voltage (ΔVbe) being applied between the first (11) and second (12) input conductors. The digital circuitry (28) controls values of currents produced by the first (I0) and second (I1) variable current sources, respectively, so as to establish a desired amplitude of the separate voltage (Vbe) and a desired amplitude and polarity of the input voltage (ΔVbe). The algorithm limits and amplitude of the output voltage (Vout) produced by the integrator (30) to thereby allow accurate operation of the reconfigurable circuitry (10) with a low power supply voltage.

In one embodiment, the invention provides a method of operating reconfigurable circuitry (10) in a hybrid delta-sigma/SAR ADC (analog-to-digital converter)(400), the reconfigurable circuitry (10) including an integrator (30) including an amplifier (15), a plurality of input capacitors (C0,1,2,3,6,7), first (C4) and second (C5) integrating capacitors, a plurality of switches (SW1-6) for selectively coupling the plurality of input capacitors (C0,1,2,3,6,7) and the first (C4) and second (C5) integrating capacitors to various terminals of the amplifier (15) and input terminals (11,12) of the integrator (30) to effectuate operation of the hybrid delta-sigma/SAR ADC (400) in delta-sigma ADC and SAR ADC modes thereof, and a comparator (22) coupled to an output voltage (Vout) of the integrator (30), the method including controlling the plurality of switches (SW1-6) by performing a plurality of cycles (Cycles2,3,4) of SAR operation of the hybrid delta-sigma/SAR ADC (400) for generating one SAR bit or each of a plurality of SAR bits, the controlling in effect creating an entire reference voltage value (Vref) equal to the sum of a first voltage (ΔVbe) of the integrator (30) and a second voltage (Vbe), performing a first cycle (Cycle2) by multiplying a residue voltage (Vresidue) of the integrator (30) by 2, performing a second cycle (Cycle3) by integrating the second voltage (Vbe) in a first direction by means of the integrator (30) if the comparator (22) changes state or in a second direction opposite to the first direction if the comparator (22) does not change state, and performing a third cycle (Cycle4) by integrating the first voltage (ΔVbe) in a direction that causes the output voltage (Vout) of the integrator (30) to equal either 2×Vresidue−Vref or 2×Vresidue+Vref, wherein Vresidue is a residue voltage which is an output voltage of the integrator (30) at the end of a preceding cycle and Vref is equal to the entire reference voltage value (ΔVbe+Vbe). In one embodiment the first voltage is an input voltage (ΔVbe) of the hybrid delta-sigma/SAR ADC (400). In one embodiment, the method includes performing a fourth cycle (Cycle1) before the first (Cycle2), second (Cycle3) and third (Cycle4) cycles, the fourth cycle (Cycle1) including integrating a value of the input voltage (ΔVbe) in a second direction by means of the integrator (30) so as to substantially reduce a voltage swing of the output voltage (Vout) of the integrator (30).

In one embodiment, the method includes producing the input voltage (ΔVbe) by controlling amounts of current through first (MN0) and second (MN1) diode-connected transistors so as to produce the input voltage (ΔVbe) as a difference between base-emitter junction voltages of the first (MN0) and second (MN1) diode-connected transistors representing a temperature of the first (NN0) and second (MN1) diode-connected transistors. The values of the currents through the first (MN0) and second (MN1) diode-connected transistors are controlled so as to establish a desired amplitude of the separate voltage (Vbe) and a desired amplitude and polarity of the input voltage (ΔVbe).

In one embodiment, the invention provides reconfigurable circuitry (10) in a hybrid delta-sigma/SAR ADC (analog-to-digital converter) (400), including integrating means (30) including an amplifier (15), a plurality of input capacitors (C0,1,2,3,6,7), first (C4) and second (C5) integrating capacitors, a plurality of switches (SW1-6) for selectively coupling the plurality of input capacitors (C0,1,2,3,6,7) and the first (C4) and second (C5) integrating capacitors to various terminals of the amplifier (15) and input terminals (11,12) of the integrator (30) to effectuate operation of the hybrid delta-sigma/SAR ADC (400) in delta-sigma ADC and SAR ADC modes thereof, and a comparator (22) coupled to an output voltage (Vout) of the integrator (30), means (28) for controlling the plurality of switches (SW1-6) by performing a plurality of cycles (Cycles2,3,4) of SAR operation of the hybrid delta-sigma/SAR ADC for generating each of a plurality of SAR bits, the controlling in effect creating an entire reference voltage value (Vref) equal to the sum of a first voltage ($\Delta$Vbe) and a second voltage (Vbe), means (28) for performing a first cycle (Cycle2) by multiplying a residue voltage (Vresidue) of the integrator (30) by 2, means (28) for performing a second cycle (Cycle3) by integrating the separate voltage (Vbe) in a first direction by means of the integrator (30) if the comparator (22) changes state or in a second direction opposite to the first direction if the comparator does not change state, and means (30) for performing a third cycle (Cycle4) by integrating the input voltage ($\Delta$Vbe) in a direction that causes the output voltage (Vout) of the integrator (30) to equal either 2×Vresidue−Vref or 2×Vresidue+Vref, wherein Vresidue is a residue voltage which is an output voltage of the integrator (30) at the end of a preceding cycle and Vref is equal to the entire reference voltage value ($\Delta$Vbe+Vbe).

DETAILED DESCRIPTION OF THE PREFERRED EMBODIMENTS

Figure 1A:
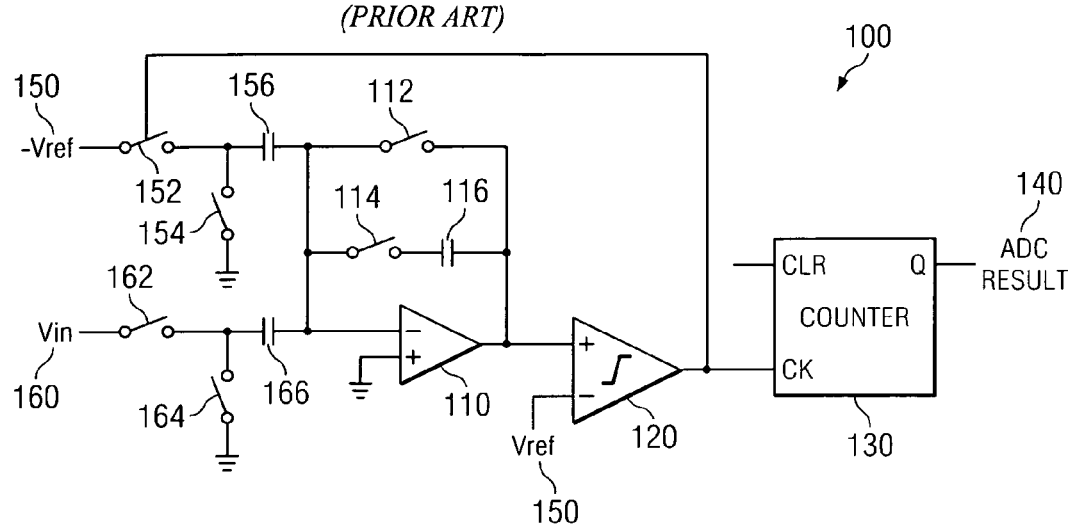
FIG. 1A depicts a conceptual prior art delta-sigma based analog to digital converter.
Figure 1B:
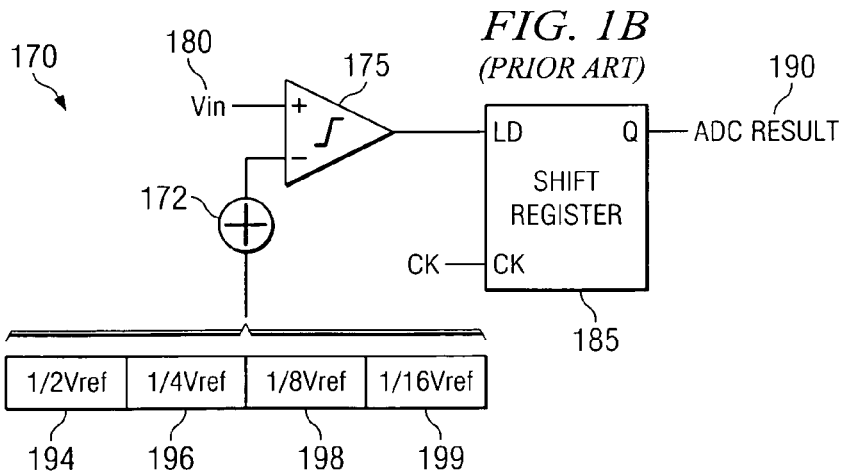
FIG. 1B depicts a conceptual prior art SAR based analog to digital converter.
Figure 2:
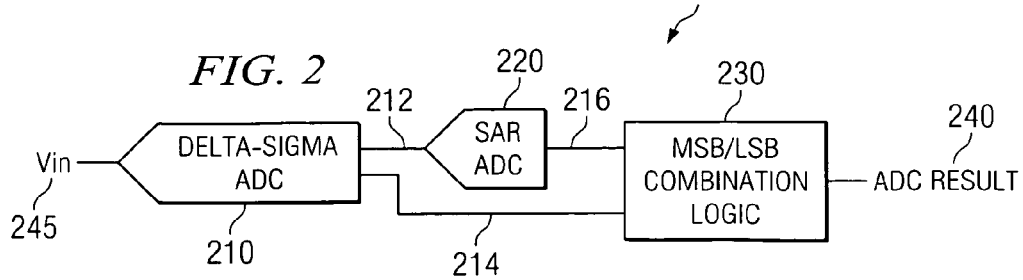
FIG. 2 shows a combined delta-sigma and SAR based analog to digital converter in accordance with various embodiments of the present invention.

Referring to FIG. 2, a combined delta-sigma and SAR (i.e., "Successive Approximation Register") based analog to digital converter (ADC) 200 in accordance with various embodiments of the present invention is depicted. Analog to digital converter 200 includes a first stage delta-sigma analog to digital converter 210, a second stage SAR analog to digital converter 220, and a combination block 230. Delta-sigma analog to digital converter 210 receives a voltage input 245 that is to be sampled. Delta-sigma analog to digital converter 210 performs a delta-sigma based analog to digital conversion that provides a first portion of a conversion result 214 and a conversion residue 212. The first portion of the conversion result 214 and conversion residue 212 are formed using delta-sigma conversion techniques that are more fully discussed below in relation to FIG. 3B. Further, it should be noted that delta-sigma analog to digital converter 210 may be implemented as any of a variety of circuits capable of implementing a delta-sigma based analog to digital conversion. As one example, delta-sigma analog to digital converter 210 may be implemented using the circuit of FIG. 3B that is more fully discussed below.

SAR analog to digital converter 220 receives the conversion residue, and performs a SAR based analog to digital conversion on the residue. The conversion is provided as a second portion of the conversion result 216. The second portion of the conversion result 216 is formed using SAR conversion techniques that are more fully discussed below in relation to FIG. 3C. Further, it should be noted that SAR analog to digital converter 220 may be implemented as any of a variety of circuits capable of implementing a SAR based analog to digital conversion. As one example, SAR analog to digital converter 220 may be implemented using the circuit of FIG. 3C that is more fully discussed below.

Both the first portion of the conversion result 214 and the second portion of the conversion result 216 are provided to a combination block 230. Combination block 230 includes circuitry that is capable of combining the first portion of the conversion result 214 with the second portion of the conversion result 216 to provide an ADC result 240. In some cases, combination block 230 simply appends the first portion of the conversion result 214 to the second portion of the conversion result 216 with the first portion of the conversion result 214 constituting the most significant bits of ADC result 240, and the second portion of the conversion result 216 constituting the least significant bits of the ADC result 240. In other cases, combination block 230 includes a shift and add function that operates to align the least significant bits of the first portion of the conversion result 214 with the most significant bits of the second portion of the conversion result 216, and thereafter adds the first portion of the conversion result 214 to the second portion of the conversion result 216.

In some embodiments, a circuit topology is used that allows reuse of the analog components of a first order delta-sigma converter with an a few additional switches to create a hybrid delta-sigma/SAR analog to digital converter. Such a circuit topology provides an analog to digital converter that supports high resolution applications without the time and noise penalties incurred when either a delta-sigma converter or a SAR converter are used separately. In particular, by combining both delta-sigma and SAR based analog to digital conversion approaches to provide a unified conversion result, low noise performance can be maintained while conversion time is reduced by two for each bit that is done with the cyclic SAR.

Figure 3A:
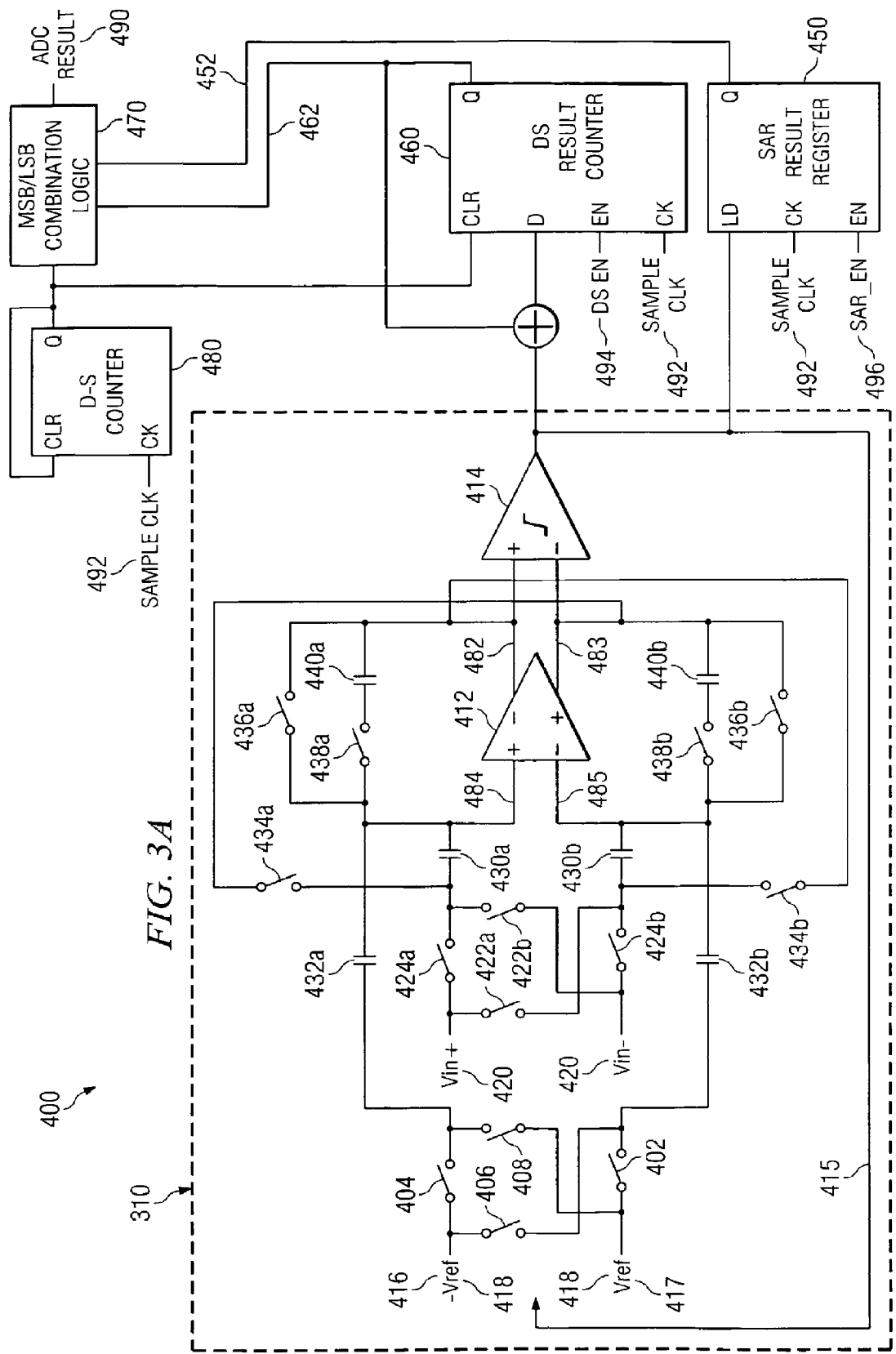
FIGS. 3A-3C show a circuit reconfigurable to perform a combination of delta-sigma and SAR based analog to digital converter in accordance with various embodiments of the present invention.
Figure 3B:
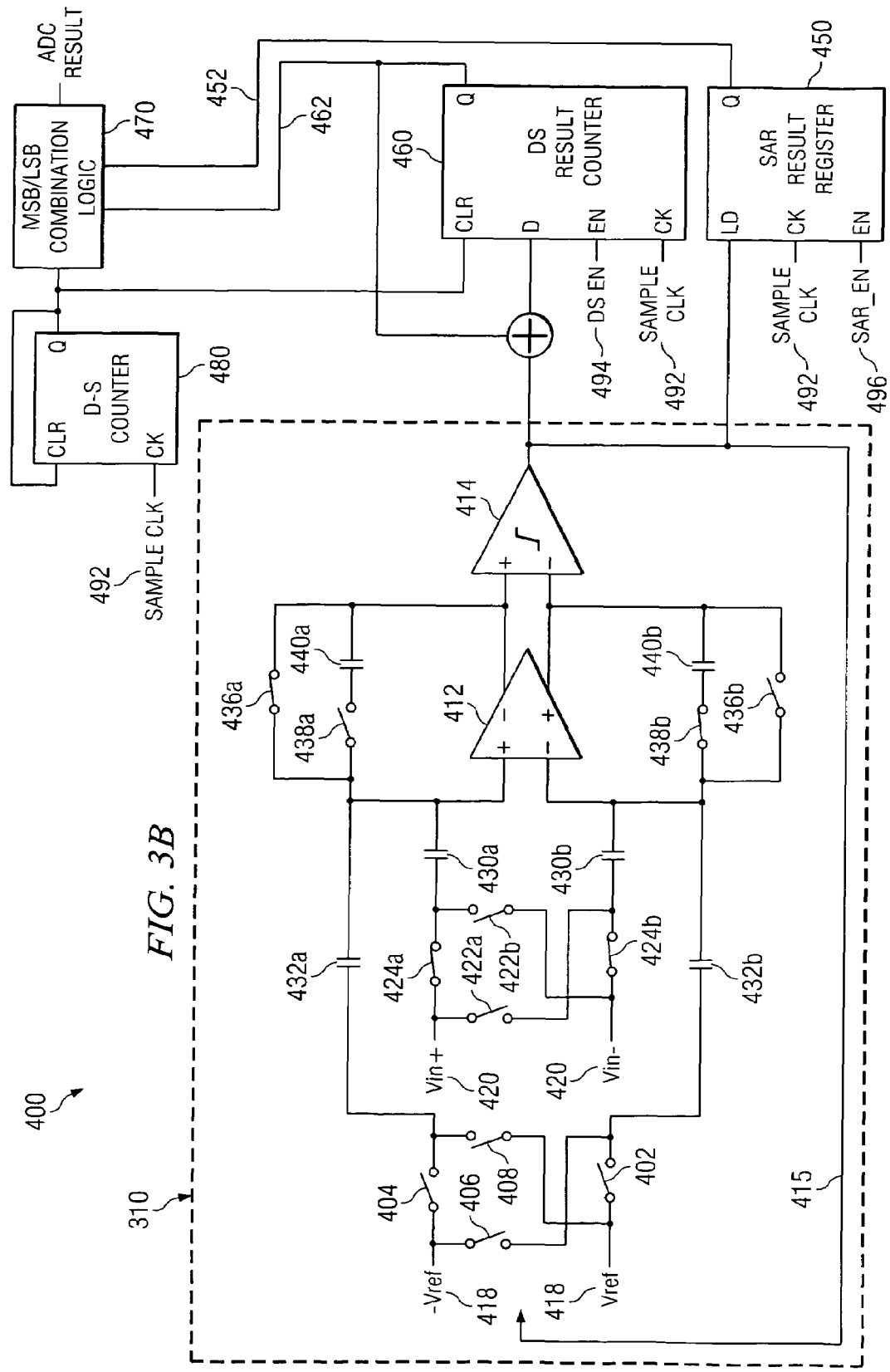
Figure 3C:
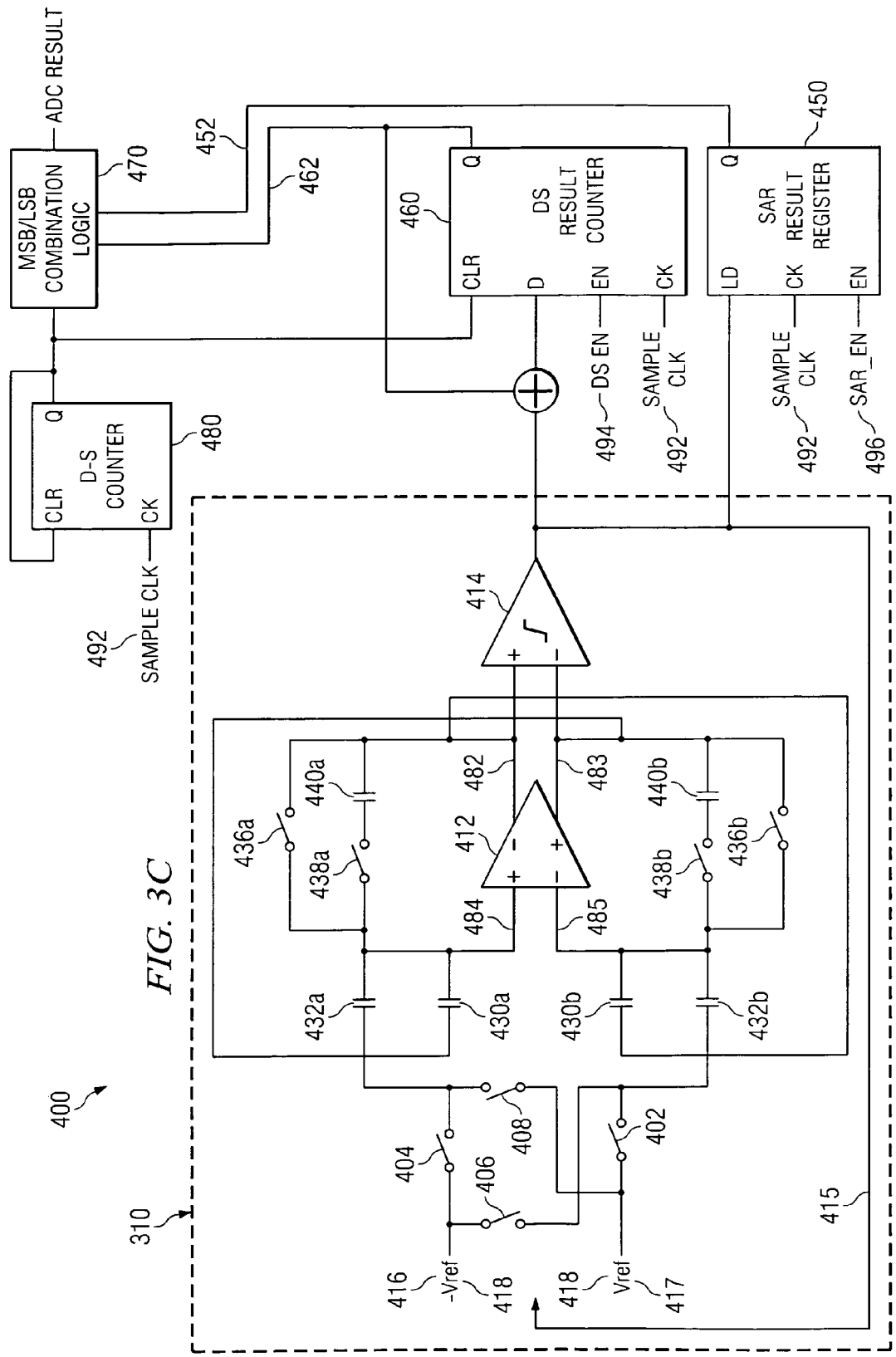

Turning to FIGS. 3A-3C, a reconfigurable analog to digital converter 400 capable of performing a combination of delta-sigma and SAR based analog to digital conversion is depicted in accordance with various embodiments of the present invention. As shown in FIG. 3A, analog to digital converter 400 includes a reconfigurable circuit 310 (outlined by a dashed line), a SAR result register 450, a delta-sigma result counter 460, a combination block 470, and a sample counter 480.

Reconfigurable circuit 310 includes groups of switches that allow for configuration as a delta-sigma analog to digital converter or a SAR analog to digital converter. When configured as a delta-sigma analog to digital converter, delta-sigma result counter 460 tallies the result of the conversion and provides a first portion of a conversion result 462 to combination block 470. Delta-sigma counter 480 is configured to count the appropriate number of samples to be processed while reconfigurable circuit 310 is configured as a delta-sigma analog to digital converter. As shown, delta-sigma counter 480 is self resetting once the appropriate number of samples are counted. In some cases, the number of delta-sigma samples is programmable. In such a case, counter 480 may be preloaded with a defined starting count. When the count is achieved, the first portion of the conversion result 462 from delta-sigma result counter 460 is provided to combination block 470, and delta-sigma result counter 460 is reset.

When configured as a SAR analog to digital converter, SAR result register 450 receives the successive conversion results and provides a second portion of the conversion result 452 to combination block 470. In some cases, SAR result register 450 places the received result in a bit position corresponding to the magnitude of the result.

As discussed above, both the first portion of the conversion result 462 and the second portion of the conversion result 452 are provided to combination block 470. Combination block 470 includes circuitry that is capable of combining the first portion of the conversion result 462 with the second portion of the conversion result 452 to provide an ADC result 490. In some cases, combination block 470 simply appends the first portion of the conversion result 462 to the second portion of the conversion result 452 with the first portion of the conversion result 462 constituting the most significant bits of ADC result 490, and the second portion of the conversion result 452 constituting the least significant bits of the ADC result 490. In other cases, combination block 470 includes a shift and add function that operates to align the least significant bits of the first portion of the conversion result 462 with the most significant bits of the second portion of the conversion result 452, and thereafter adds the first portion of the conversion result 462 to the second portion of the conversion result 452.

Reconfigurable circuit 310 includes a voltage reference 418 that is capable of providing a negative polarity voltage reference 416 and a positive polarity voltage reference 417. Both of the aforementioned voltage references are switched into reconfigurable circuit 310 using switches 402, 404, 406, 408. It should be noted that various other circuits using fewer switches may be implemented in accordance with one or more embodiments of the present invention that allow for switching positive and negative voltage references into a circuit. Negative voltage reference 416 is electrically coupled to a reference sample capacitor 432a via a switch 404, and to a reference sample capacitor 432b via a switch 406. Positive voltage reference 417 is electrically coupled to reference sample capacitor 432a via a switch 408, and to reference sample capacitor 432b via a switch 402.

A positive side of a differential voltage input 420 is electrically coupled to an input sample capacitor 430a via a switch 424a, and to an input sample capacitor 430b via a switch 422a. A negative side of differential voltage input 420 is electrically coupled to input sample capacitor 430a via a switch 422b, and to input sample capacitor 430b via a switch 424b. In addition, input sample capacitor 430a is electrically coupled to a positive output 483 of a differential operational amplifier 412 via a switch 434a, and input sample capacitor 430b is electrically coupled to a negative output 482 of differential operational amplifier 412 via a switch 434b. The other side of input sample capacitor 430a is electrically coupled to a positive input 484 of differential operational amplifier 412, to negative output 482 via a switch 436a, and to negative output 482 via a switch 438a and an integrating capacitor 440a. The other side of input sample capacitor 430b is electrically coupled to a negative input 485 of differential operational amplifier 412, to positive output 483 via a switch 436b, and to positive output 483 via a switch 438b and an integrating capacitor 440b. Negative output 482 of differential operational amplifier 412 is electrically coupled to a positive input of a differential comparator 414, and positive output 483 is electrically coupled to a negative input of differential comparator 414.

As an overview of the operation of analog to digital converter 400, a set amount of samples are taken when analog to digital converter 400 is configured for delta-sigma analog to digital conversion leaving a residue charge on integrating capacitors 440. The conversion residue on the integrator at the end of a fixed number of cycles is further sampled by configuring analog to digital converter 400 as a SAR analog to digital converter. Doing such increases resolution without the dramatic increase in conversion time required where a delta-sigma converter is used alone. A recursive SAR analog to digital converter is created by disconnecting the input sample capacitors 430 from differential voltage input 420, and reusing the capacitors to create a gain of two on the integrator including differential operational amplifier 412.

In some embodiments, there is a programmable tradeoff between the time spent developing a conversion result using a delta-sigma approach and the time spent developing the conversion result using a SAR approach. The resolution of ADC 400 is given by the expression N bits=n+m, where n equals the number of delta-sigma bits in the final result and m equals the number of SAR bits in the result, and programmability of the trade-off conversion time versus noise performance and power and therefore is represented by the expression Total Number of Samples Required to Produce the Result=$2^n$+m.

Configuring reconfigurable circuit 310 as a delta sigma analog to digital converter includes opening switches 434 as shown in FIG. 3B. Turning to FIG. 3B, while operating as a delta sigma analog to digital converter, switches 424 are closed, switches 422 are opened, switches 436 are closed and switches 438 are opened. This configuration provides a sample phase where a charge corresponding to differential voltage input 420 is stored on input sample capacitors 430. In the next phase (i.e., the integration phase), switches 424 are opened, switches 422 are closed, switches 436 are opened and switches 438 are closed. This causes the charge from input sample capacitors 430 to transfer to integrating capacitors 440. The aforementioned sample phase and integration phase may be accomplished on succeeding edges (using both positive and negative edges) of a clock, on succeeding negative edges of the clock, or on succeeding positive edges of the clock.

Transferring the charge from input sample capacitors 430 to integrating capacitors 440 results in an output from differential operational amplifier 412 at the input of differential comparator 414. The output of differential operational amplifier 412 is processed by differential comparator 414 to produce either a logic '1' or a logic '0' depending upon positive output 483 of differential operational amplifier 412 relative to negative output 482 of differential operational amplifier 412. Where the result is a logic '0', result counter 460 is not incremented. On the next pass, switches 402, 404, 406, 408 are configured such that voltage reference 418 is not sampled via reference sample capacitors 432 under the direction of feedback 415 (it should be noted that differential input voltage 420 is still sampled on the next pass). Alternatively, on any pass where the result of the comparison is a logic '1', result counter 460 is incremented. It should be noted that incrementing delta-sigma result counter 460 is only enabled when the circuit is operating as a delta-sigma circuit as indicated by DS EN 494, and thus delta-sigma result counter 460 is not incremented during the SAR operational mode. Further, where the result is a logic '1', switches 402, 404, 406, 408 are configured such that negative voltage reference 416 is sampled via reference sample capacitors 432 along with differential input voltage 420. Over a number of sampling periods, the digital value representing the voltage at differential voltage input 420 is that maintained on result counter 460.

The discussion in the preceding paragraph applies to the single-comparator application as shown. In contrast, where a window comparator is used one of three results is possible: (1) above an upper threshold, (2) between an upper and lower threshold, and (3) below the lower threshold. Where the result is above the upper threshold, result counter 460 is incremented, and on the next pass voltage reference 418 is sampled in a negative polarity along with differential voltage input 420. Where the result is above a lower threshold and below an upper threshold, voltage reference 418 is not sampled and result counter 460 is not incremented. Where the result is below a lower threshold, result counter 460 is decremented, and on the next pass voltage reference 418 is sampled in a positive polarity along with differential voltage input 420.

Increasing the number of samples processed results in a greater resolution on delta-sigma result counter 460. At some point, however, a very large number of iterations are required to gain one additional bit of resolution. For example, approximately one thousand iterations are required to increase from ten to eleven bits of resolution. Thus, in some embodiments, after a certain resolution is achieved (as indicated by delta-sigma sample counter 480) through use of delta-sigma based analog to digital conversion, one or more of the switches of reconfigurable circuit 310 are selected such that operation as a SAR analog to digital converter is enabled to convert the remaining conversion residue (i.e., the charge remaining on integrating capacitors 440 at the end of operating as a delta-sigma analog to digital converter).

Configuring reconfigurable circuit 310 as a SAR based analog to digital converter includes closing switches 434, and opening switches 422 and switches 424 as shown in FIG. 3C. Turning to FIG. 3C, while operating as a SAR analog to digital converter, the residue charge remaining after the previously described delta-sigma operation is stored on integrating capacitors 440, and differential voltage input 420 is no longer sampled (i.e., switches 422 and switches 424 are opened). Switches 436 are closed causing input sample capacitors 430 to discharge (assuming there is no offset to differential operational amplifier 412). Then, switches 436 are opened and switches 438 are closed while switches 402, 404, 406, 408 remain open. With switches 438 closed, the remaining charge originally maintained on integrating capacitors 440 is redistributed as differential operational amplifier 412 tries to drive the difference between positive input 484 of differential operational amplifier 412 and negative input 485 to zero.

As previously stated, negative output 482 of differential operational amplifier 412 is electrically coupled to a positive input of a differential comparator 414, and positive output 483 is electrically coupled to a negative input of differential comparator 414. The output of differential comparator 414 is provided to SAR result register 450 that places each output in a particular bit position corresponding to the sample period in which the output corresponds (i.e., which bit the output is to assume in the final result). Further, differential comparator 414 drives feedback 415 that controls switches 402, 404, 406, 408 in the application of the appropriate polarity of voltage reference 418 depending upon the output of differential comparator 414.

Differential comparator 414 may be configured for unipolar function (i.e., to function as a single comparator operable to detect an over-threshold or under-threshold condition) to process the residue charge left on integrating capacitors 440. Similarly, two comparators may be used in place of differential comparator 414 to provide bipolar functionality (i.e., to function as two comparators operable to detect excess of an upper threshold, detect less than a lower threshold, or detect a condition between the upper and lower thresholds).

Where unipolar functionality is used (i.e., that shown in FIG. 3A), a single comparator is used to process the residue charge left on integrating capacitors 440. The process for unipolar functionality is represented by the following set of equations implemented on a first operational cycle:

If (Vresidue > Vthreshold) then
    Vout1 = 2*(Vresidue − Vref)
Else
    Vout1 = 2*(Vresidue)
End If.

The augmentation by negative voltage reference 416 (i.e., −Vref) is controlled by properly selecting the positions of switches 402, 404, 406, 408 as directed by feedback 415. During the next operational cycle, the operation is described by the following equation regardless of the output of differential comparator 414:

$V\text{out2} = (V\text{out1} + V\text{ref})$.

In this pass, the analog to digital converter is configured in the delta-sigma mode similar to that shown in FIG. 3B so that a gain of two does not occur, yet the differential voltage input 420 is still not sampled. It should be noted that for the aforementioned unipolar operation, one bit of resolution is generated for each two SAR cycles.

For bipolar functionality (not shown) there are three possible comparator states generated through use of two comparators: (1) above an upper threshold, (2) below a lower threshold, or (3) between the upper and lower thresholds. In this case, only a single SAR cycle is used to create a bit of resolution as described by the following equations:

If (Vresidue > +Vthreshold) Then
    Vout = 2*(Vresidue − Vref)
Else If (Vresidue < −Vthreshold) Then
    Vout = 2*(Vresidue + Vref)
Else
    Vout = 2*(Vresidue)
End If.

It should be noted that other processing approaches in addition to the aforementioned unipolar and bipolar approaches may be used in accordance with one or more embodiments of the present invention. For example, a single comparator circuit may be implemented such that only one half of Vref is sampled. In such an approach, a single comparator may be used in a circuit that produces one bit of resolution for each SAR cycle.

The previously described process of multiplying the conversion residue (in some cases after adding or subtracting the voltage reference) and comparing may be repeated until a desired resolution of the second portion of the conversion result 452 is achieved. As previously discussed, the first portion of the conversion result 462 and the second portion of the conversion result are then combined in combination block 470 to produce ADC result 490. Once the last bit is derived from reconfigurable circuit 310 operating as a SAR analog to digital converter to produce ADC result 490, reconfigurable circuit 310 may again be configured to operate as a delta-sigma analog to digital converter as depicted in FIG. 3B. From this point, differential voltage input 420 is again sampled using the delta-sigma analog to digital converter, and the residue of that conversion is processed using a SAR analog to digital conversion.

Figure 4:
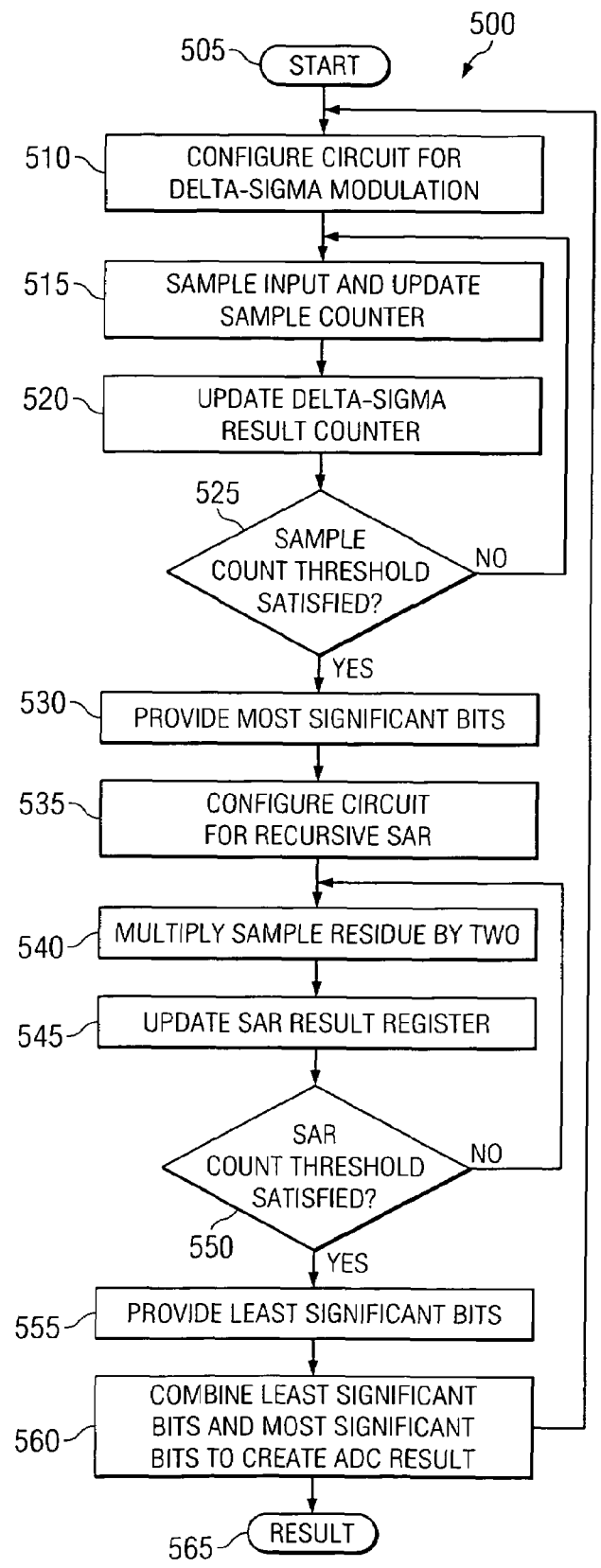
FIGS. 4 and 5 are flow diagrams showing methods in accordance with embodiments of the present invention for performing analog to digital conversion.

Referring to FIG. 4, a flow diagram 500 shows a conversion process which is started (block 505) by configuring a reconfigurable analog to digital conversion circuit to operate as a delta-sigma analog to digital converter (block 510). This may include setting one or more switches as discussed in relation to FIG. 3 above. With the circuit thus configured (block 510), a voltage input is sampled and the sample counter is incremented (block 515). Based on the sample, the delta-sigma result counter is updated (block 520). It is then determined if a predefined number of samples have been processed (block 525). Where the predefined number of samples have not yet been processed (block 525), the processes of blocks 515-525 are repeated.

Otherwise, where the predefined number of samples have been processed (block 525), the most significant bits of a conversion result are provided to a register (block 530). Further, the reconfigurable analog to digital conversion circuit is configured to operate as a SAR analog to digital converter (block 535). With the circuit thus configured (block 535), the sample residue left over from the prior delta-sigma process is multiplied by two (block 540). The multiplied sample residue is compared with a voltage reference, the result of the comparison is used to update a SAR result register, and a sample count is incremented (block 545). The sample count is compared to a SAR count threshold (block 550). Where the sample count is less than the SAR count threshold (block 550), the processes of blocks 540, 545, 550 are repeated.

Alternatively, where the sample count is equal to the SAR count threshold (block 550), the least significant bits of the conversion result are provided to a register (block 555). Next, the most significant bits and the least significant bits of the conversion result are combined to create a final ADC result (block 560). This process generates a result (block 565) that may be done by appending the two sets of bits, or by shifting and adding the two sets of bits depending upon the conversion process used.

Figure 5:
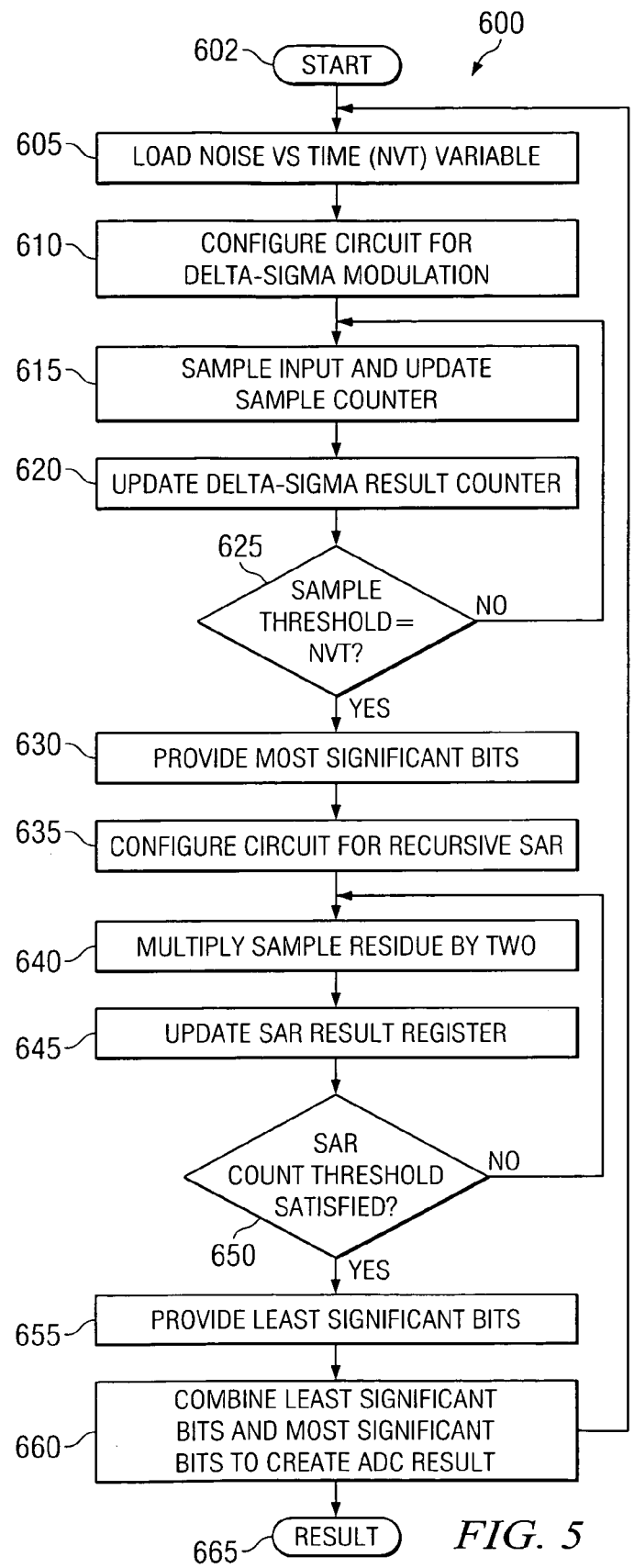

Referring to FIG. 5, a flow diagram 600 shows a method for performing analog to digital conversion where the number of delta-sigma bits and the number of SAR bits in the final result is programmable. Following flow diagram 600, a conversion process is started (block 602) by loading a noise verses time variable (NVT) (block 605). As discussed below, NVT controls the number of delta-sigma analog to digital conversion iterations compared to the number of SAR analog to digital conversion iterations that are performed. In a typical implementation, a defined resolution for a final analog to digital conversion result is produced. NVT controls the amount of delta-sigma vs. SAR iterations used to produce the resolution.

A reconfigurable analog to digital conversion circuit is configured to operate as a delta-sigma analog to digital converter (block 610). This may include setting one or more switches as discussed in relation to FIG. 3 above. With the circuit thus configured (block 610), a voltage input is sampled and the sample counter is incremented (block 615). Based on the sample, the delta-sigma result counter is updated (block 620). It is then determined if a set number of bits for a final conversion result have been produced using the delta-sigma conversion process (block 625). Where the predefined number of samples have not yet been processed (block 625), the processes of blocks 615-625 are repeated.

Otherwise, where the predefined number of samples have been processed (block 625), the most significant bits of a conversion result are provided to a register (block 630). Further, the reconfigurable analog to digital conversion circuit is configured to operate as a SAR analog to digital converter (block 635). With the circuit thus configured (block 635), the sample residue left over from the prior delta-sigma process is multiplied by two (block 640). The multiplied sample residue is compared with a voltage reference, the result of the comparison is used to update a SAR result register, and a sample count is incremented (block 645). The sample count is compared to a total desired resolution of the final conversion results less the $Log_2(NVT)$ (block 650). Where the sample count is less than the prescribed number of bits (block 650), the processes of blocks 640, 645, 650 are repeated.

Alternatively, where the sample count is equal to the prescribed number of bits (block 650), the least significant bits of the conversion result are provided to a register (block 655). Next, the most significant bits and the least significant bits of the conversion result are combined to create a final ADC result (block 660). This process generates a result (block 665) that may be done by appending the two sets of bits, or by shifting and adding the two sets of bits depending upon the conversion process used.

Figure 6:
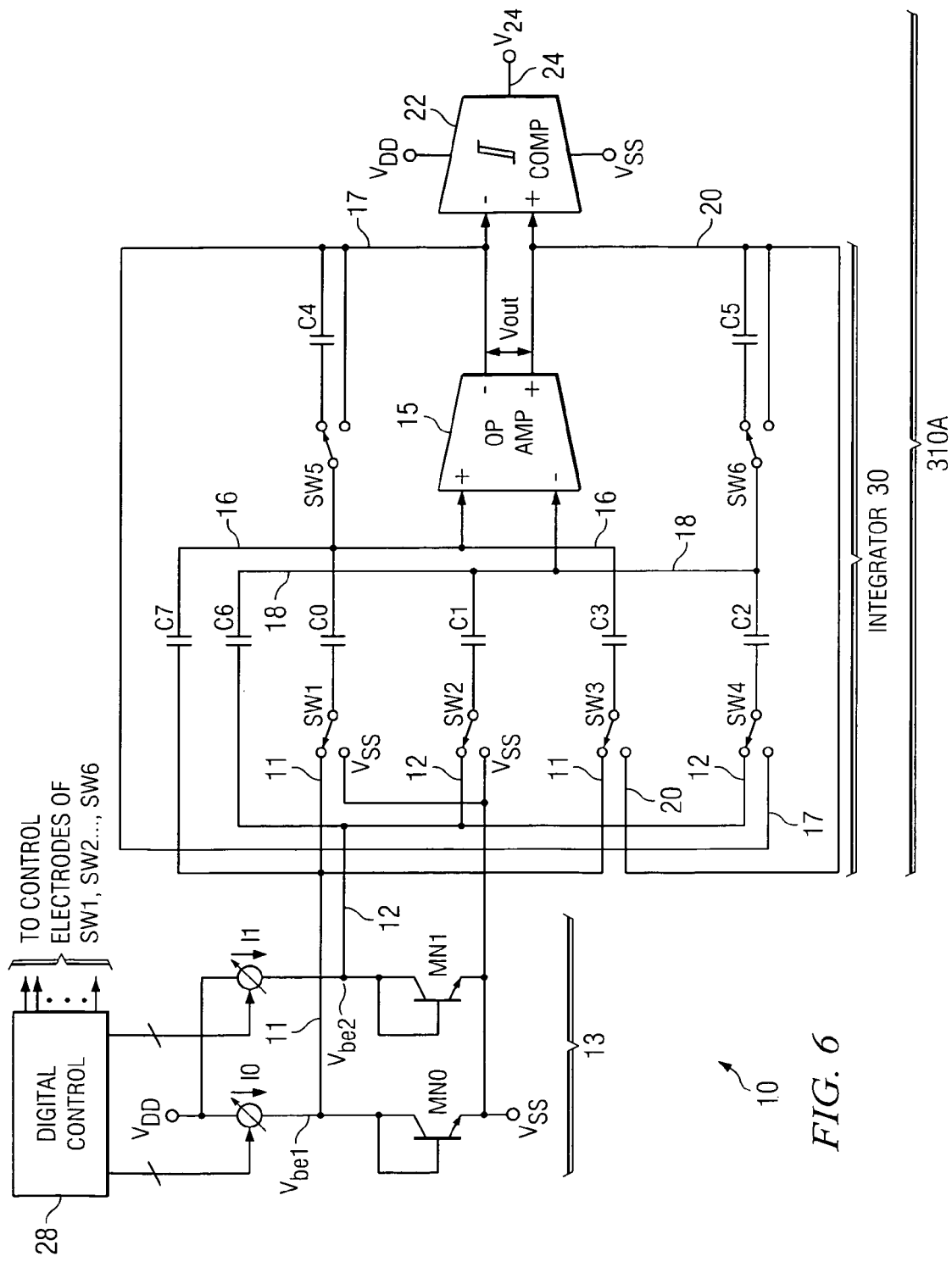
FIG. 6 is a schematic diagram of integrator and comparator circuitry which is shared between the delta-sigma integration mode and the SAR mode of a hybrid delta-sigma/SAR ADC in accordance with a temperature sensor embodiment of the present invention.

FIG. 6 shows a schematic implementation of a reconfigurable part 10 of an integrated circuit temperature sensor including an analog temperature-sensing input circuit 13 which generates the input signal ΔVbe for a reconfigurable circuit 310A that is substituted for reconfigurable circuit 310 in FIG. 3A. Controllable current sources I0 and I1 together with diode-connected transistors MN1 and MN2 are used to create the input voltage ΔVbe voltage applied between the inputs 11 and 12 of reconfigurable circuit 310A. In accordance with the present invention, controllable current sources I0 and I1 and diode-connected transistors MN1 and MN2 also are used to create a two-part "entire reference voltage" that is equal to the sum of ΔVbe and Vbe wherein the two parts are used at separate times.

Reconfigurable circuitry 10 also includes a differential amplifier or operational amplifier 15 having its (−) output coupled by conductor 17 to the (−) input of a comparator 22 and having its (+) output coupled by conductor 20 to the (+) input of comparator 22. Operational amplifier 15 can be the same as or similar to amplifier 412 of FIG. 3A, and comparator 22 is a single comparator (rather than a window comparator). The output 24 of comparator 22 can be coupled to delta-sigma result counter 460, SAR result register 450, and MSB/LSB combination logic 470 of FIG. 3A.

The (+) input of operational amplifier 15 is coupled by conductor 16 to the pole terminal of single pole, double throw switch SW5 and to one terminal of each of capacitors C0, C3, and C7. The (−) input of operational amplifier 15 is coupled by conductor 18 to the pole of single pole double throw switch SW6 and to one terminal of each of capacitors C2, C1, and C6. One terminal of switch SW5 is coupled to one terminal of a capacitor C4, the other terminal of which is connected to conductor 17. The other terminal of switch SW5 is connected to conductor 17. One terminal of switch SW6 is coupled to one terminal of a capacitor C5, the other terminal of which is connected to conductor 20. The other terminal of switch SW6 is connected to conductor 20.

The second terminal of capacitor C0 is connected to the pole of a single pole, double throw switch SW1, one terminal of which is connected by conductor 11 to the second terminal of capacitor C7. Conductor 11 also is connected to one terminal of switch SW3. Another terminal of switch SW1 is connected to $V_{SS}$. The second terminal of capacitor C1 is connected to the pole of a single pole double throw switch SW2, one terminal of which is connected by conductor 12 to the second terminal of capacitor C6 and one terminal of single pole, double throw switch SW4. Another terminal of switch SW4 is connected to conductor 17. The second terminal of capacitor C2 is connected to the pole of switch SW4. The second terminal of capacitor C3 is connected to the pole of a single pole, double throw switch SW3, one terminal of which is connected by conductor 11 to the second terminal of capacitor C7. The other terminal of switch SW3 is connected to conductor 20.

Conductor 11 is connected to one terminal of a controllable current source I0, the other terminal of which is connected to $V_{DD}$. Conductor 11 also is connected to the collector and base of a NPN transistor MN0, the emitter of which is connected to $V_{SS}$. A voltage Vbe1 is produced on conductor 11 by controllable current source I0 and transistor MN0. Similarly, conductor 12 is connected to one terminal of a controllable current source I1, the other terminal of which is connected to $V_{DD}$. Conductor 12 also is connected to the collector and base of a NPN transistor MN1, the emitter of which is connected to $V_{SS}$. A voltage Vbe2 is produced on conductor 12 by controllable current source I1 and transistor MN1.

Each of controllable current sources I0 and I1 can consist of a group of identical current sources and switches that are digitally controlled by a digital control circuit 28. Digital control circuit 28 controls current sources I0 and I1 and switches SW1-6 so as to effectuate operation of configurable circuit 10 in conjunction with delta-sigma ADC operation and SAR ADC operation of a hybrid delta-sigma/SAR ADC. More specifically, digital control circuit 28 allows a single current source to be selected and also allows any number of the identical current sources to be selected in parallel to form controllable current source I0 or I1. This allows the amplitude and polarity of ΔVbe and the amplitude of Vbe to be determined in response to digital control circuit 28 during both the delta-sigma ADC operation phase and the SAR ADC operation phase of ADC 400 of FIG. 3A when it is configured as a temperature controller by replacing reconfigurable circuit 310 of FIG. 3A with reconfigurable circuit 310A of FIG. 6. The various algorithms described herein are executed by means of digital control circuit 28, which can be readily implemented by one skilled in the art.

Each of the single pole, double throw switches in FIG. 6 can be implemented by means of a pair of switches, each of which can be implemented by means of a MOS transistor or a CMOS transmission gate. For example, single-pole, double throw switch SW6 in FIG. 6 can be the same as the combination of switches 438b and 436b shown in FIG. 3A, each of which can be a MOS transistor or a CMOS transmission gate (which includes a P-channel transistor connected in parallel with a N-channel transistor).

In FIG. 6, digital control circuit 28 of reconfigurable circuit 10 determines when and how to control current sources I0 and I1 so as to produce the values of +ΔVbe, −ΔVbe, and Vbe as inputs to integrator 30 as needed by the subsequently described "SAR mode algorithm". ΔVbe is sampled using all of the input capacitors in FIG. 6 because the ΔVbe voltage often is a relatively small voltage, typically a few tens of millivolts, depending on the temperature, the ratio of the currents I0 and I1, and the ratios of the emitter areas of transistors MN0 and MN1, while the Vbe voltage often is a larger voltage, typically hundreds of millivolts. In order to correctly scale the reference voltage, ΔVbe is sampled onto more input capacitors than the Vbe voltage, which is sampled using only capacitors C0 and C1. That is, the various switches SW1,2 ... 6 are configured by digital control circuit 28 such that when a ΔVbe voltage is being sampled, all of the input capacitors are used. When a Vbe voltage is sampled, only capacitors C0 and C1 are used, with I0 and I1 being set to identical values by means of digital control circuit 28. When integrator 30 is configured by digital control circuit 28 to perform Cycle 2 of the subsequently described SAR mode algorithm so as to multiply the previous residue of integrator 30 by 2, then capacitors C3 and C2, each having a capacitance equal to half that of capacitors C4 and C5, are used. That is, the maximum value of input capacitance is used to sample ΔVbe, and the portions of the input capacitance are used as necessary to perform other functions, including sampling of Vbe.

The above mentioned capacitance scaling is necessary because sampling of the voltage between conductors 11 and 12 involves transfer of charge from the input capacitors used in the sampling to the integrating capacitors C4 and C5, causing a change in the integrator output voltage Vout. If the capacitances of integrating capacitors C4 and C5 are small, the transferred charge will result in an increased magnitude of the change in Vout. (The magnitude of the change in Vout could be reduced by increasing the capacitances of integrating capacitors C4 and C5, but this would result in an undesirable increase in integrated circuit chip area and an undesirable increase in the quiescent current Iq required in order to drive the integrating capacitors.) During sampling operations, either ΔVbe or Vbe is sampled, and each typically varies between one third of Vref and two thirds of Vref. Integrating capacitors C4 and C5 are scaled so they can receive the transferred charge so as to produce an adequately large value of integrator output Vout that is well below the saturation point of integrator 30. Then, as will be subsequently explained in more detail, during SAR ADC operation it is necessary to multiply by 2, which doubles the value of Vout that resulted from the previous integration, and then the full value of Vref must be either added to or subtracted from the doubled value of Vout. This imposes severe limitations on integrator output swing if low power supply voltages are required.

The input voltage ΔVbe applied by input circuit 13 between the inputs 11 and 12 of integrator 30 must be digitized by comparison with a reference voltage. However, in the circuit of FIG. 6, there is no existing reference voltage source. In accordance with the present invention, the effect of having a single reference voltage source is provided by creating an "entire reference voltage" Vref by using both the present ΔVbe=Vbe1−Vbe2 voltage (which is a PTAT voltage i.e., a Proportional to Absolute Temperature voltage) and the present Vbe voltage, which is equal to the voltage Vbe1 on conductor 11 or Vbe2 conductor 12 and is negatively proportional to the absolute temperature. More specifically, the entire reference voltage Vref is generated by combining the present Vbe voltage and the present ΔVbe voltage in a proportion so as to provide either a temperature-independent entire reference voltage or one having a desired temperature dependence.

A sample of ΔVbe is performed in one cycle, as follows. Since the ΔVbe voltage difference between Vbe1 and Vbe2 is much smaller than the Vbe voltage, all of input capacitors C0-C3 and C6 and C7 are used to sample ΔVbe. For this, sample switches SW1 to SW4 are in the configuration shown in FIG. 6, with Vbe1 coupled to capacitors C0, C3 and C7 and Vbe2 connected to capacitors C1, C2 and C6. The ΔVbe voltage is generated by diode-connected transistors MN1 and MM0. The current in diode-connected transistor MN1 is controlled by control circuit 28 to be larger or smaller than the current in diode-connected transistor MN0, which creates the ΔVbe voltage equal to Vbe1-Vbe2 between conductors 11 and 12. During the first half cycle of every cycle of the subsequently described SAR mode algorithm, switches SW5 and SW6 are switched to connect conductor 16 directly to conductor 17 and also to connect conductor 18 directly to conductor 20 to accomplish zeroing during the first half of every cycle for both delta-sigma ADC operation and SAR ADC operation by means of switches SW5 and SW6. This "zeroing" shorts the corresponding inputs and outputs of operational amplifier 15 and thereby stores the operational amplifier offset voltages on the input capacitors, and thereby zeroes all offset voltages.

The input capacitors connected to conductor 16 are charged to a differential input voltage that is equal to ΔVbe relative to the input capacitors coupled to conductor 18. During the second half cycle of the present cycle, switches SW5 and SW6 are actuated to couple capacitors C4 and C5 as feedback elements of amplifier 15. Then the values of current sources I0 and I1 are swapped (i.e., the value of I0 becomes equal to the value of I1 and vice versa during the first half cycle). The ADC input voltage between conductors 11 and 12 then becomes equal in magnitude and opposite in polarity to ΔVbe. This change of the input differential voltage from ΔVbe to -ΔVbe causes a charge transfer through the various input capacitors C0, C3 and C7 and input capacitors C1, C2 and C6 and thereby causes the (+) and (-) output voltages of amplifier 15 to change and causes the corresponding transferred charges to be stored on integrating capacitors C4 and C5, respectively.

The polarity of the ΔVbe voltage sample thus is determined by controllable current sources I0 and I1. That is, if I0 is relatively small during the first half cycle and is relatively large during the second half cycle, the integrator integrates "+ΔVbe". If I0 is relatively large during the first half cycle and relatively small during the second half cycle, the integrator integrates "-ΔVbe".

When a Vbe voltage (rather than a ΔVbe voltage) is sampled, the current sources I0 and I1 are set to be equal, with switches SW3 and SW4 in the configuration shown in FIG. 6. One of the switches SW1 or SW2 is switched to the configuration opposite to that shown in FIG. 6. The capacitors C1 and C0 therefore store a Vbe differential voltage, and all other input capacitors are at 0 volt differential input level. During the second half cycle switches SW5 and SW6 are released to the configurations illustrated in FIG. 6, and capacitors C4 and C5 are connected as feedback of amplifier 15. Then switches SW1 and SW2 are actuated so that they exchange their values (i.e., the state of switch SW1 becomes equal to the state of switch SW2 during the first half of the cycle and vice versa). Then the differential voltage on input capacitors C1 and C0 becomes equal to Vbe but with opposite polarity, i.e., becomes -Vbe. The voltages on conductors 11 and 12 do not change because the currents in current sources I0 and I1 do not change. The change of the input differential voltage on capacitors C1 and C0 from +Vbe to -Vbe causes a charge transfer through capacitors C1 and C0. This causes the (+) and (-) output voltages of amplifier 15 to change and causes the corresponding charges to be transferred onto integrating capacitors C4 and C5, respectively. The polarity of the Vbe voltage sample is determined by the sequence of actuating switches SW1 and SW2. That is, if switch SW1 is switched to $V_{SS}$ during the first half of the cycle and to conductor 11 during the second half cycle, integrator 15 integrates "+Vbe". If SW1 is switched to conductor 11 during the first half of the cycle and to $V_{SS}$ during the second half of the cycle, then integrator 15 integrates "-Vbe".

When a multiplication by 2 is needed in the subsequently described SAR mode algorithm, switches SW3 and SW4 are actuated so that capacitor C3 is connected as a positive feedback element between the (+) input and the (+) output of amplifier 15, and so that capacitor C2 is connected as a positive feedback element between the (-) input and the (-) output of amplifier 15. In this mode, current sources I0 and I1 are equal, switches SW1 and SW2 are not switched, i.e., they remain in the configuration shown in FIG. 6, and the input capacitors C1, C0, C6 and C7 store no differential input voltage. During the first half of Cycle 2 of the subsequently described SAR algorithm, switches SW5 and SW6 are actuated so as to short the corresponding inputs and outputs of amplifier 15 and thereby zero all offset voltages. Capacitors C2 and C3 store only the offset voltage of operational amplifier 15. During the second half of Cycle 2, switches SW5 and SW6 are actuated so as to connect capacitors C4 and C5 as integrating capacitors of amplifier 15. Then the positive feedback in the integrator 30 formed by operational amplifier 15 and capacitors C2 and C3 causes the integrator to increase its output voltage between conductors 17 and 20. If input capacitors C3 and C2 are half the value of input capacitors C4 and C5, then the output of the integrator is doubled (the charge on C4 and C5 is doubled), so the desired multiplication of the integrator residue voltage Vresidue by 2 is performed.

Reconfigurable circuit 10 of FIG. 6, when substituted for reconfigurable circuit 310 in FIG. 3A with FIG. 6, provides a complete self-contained integrated circuit temperature sensor including a hybrid delta-sigma/SAR ADC in which the delta-sigma ADC and SAR ADC conversion processes are generally the same as described above with reference to FIGS. 2-5. However, that temperature sensor is capable of operating from a substantially lower power supply voltage and requires substantially less integrated circuit chip area than ADC 400 of FIG. 3A. When circuit 10 of FIG. 6 is substituted for reconfigurable circuit 310 of FIG. 3A and is configured for delta-sigma analog-to-digital converter operation, delta-sigma result counter 460 of FIG. 3A tallies the result of the conversion for a set number of samples and provides a first portion of a conversion result 462 to combination block 470, as previously described. After a set number of samples processed while reconfigurable circuit 310 is configured as a delta-sigma analog to digital converter, a residue voltage remains on the feedback/integrating capacitors C4 and C5 and therefore remains as the output voltage of integrator 30 in FIG. 6.

For the SAR ADC mode of operation, one additional function, the multiplication by 2, is included. Four cycles are utilized to generate each bit in the SAR ADC mode. Reconfigurable circuit 10 of FIG. 6 performs additions and subtractions (i.e., integrations in the positive and negative directions, respectively, of Vbe or ΔVbe, or amplifies the integrator residue (i.e., the voltage remaining on the integrator output at the end of the delta-sigma ADC conversion) by the factor of 2, in the four cycles. This is done according to the following algorithm, expressed in conventional pseudocode and referred to herein as the "SAR mode algorithm", which also is set forth as a flow diagram in FIG. 7:

Cycle 1:

---

Figure 7:
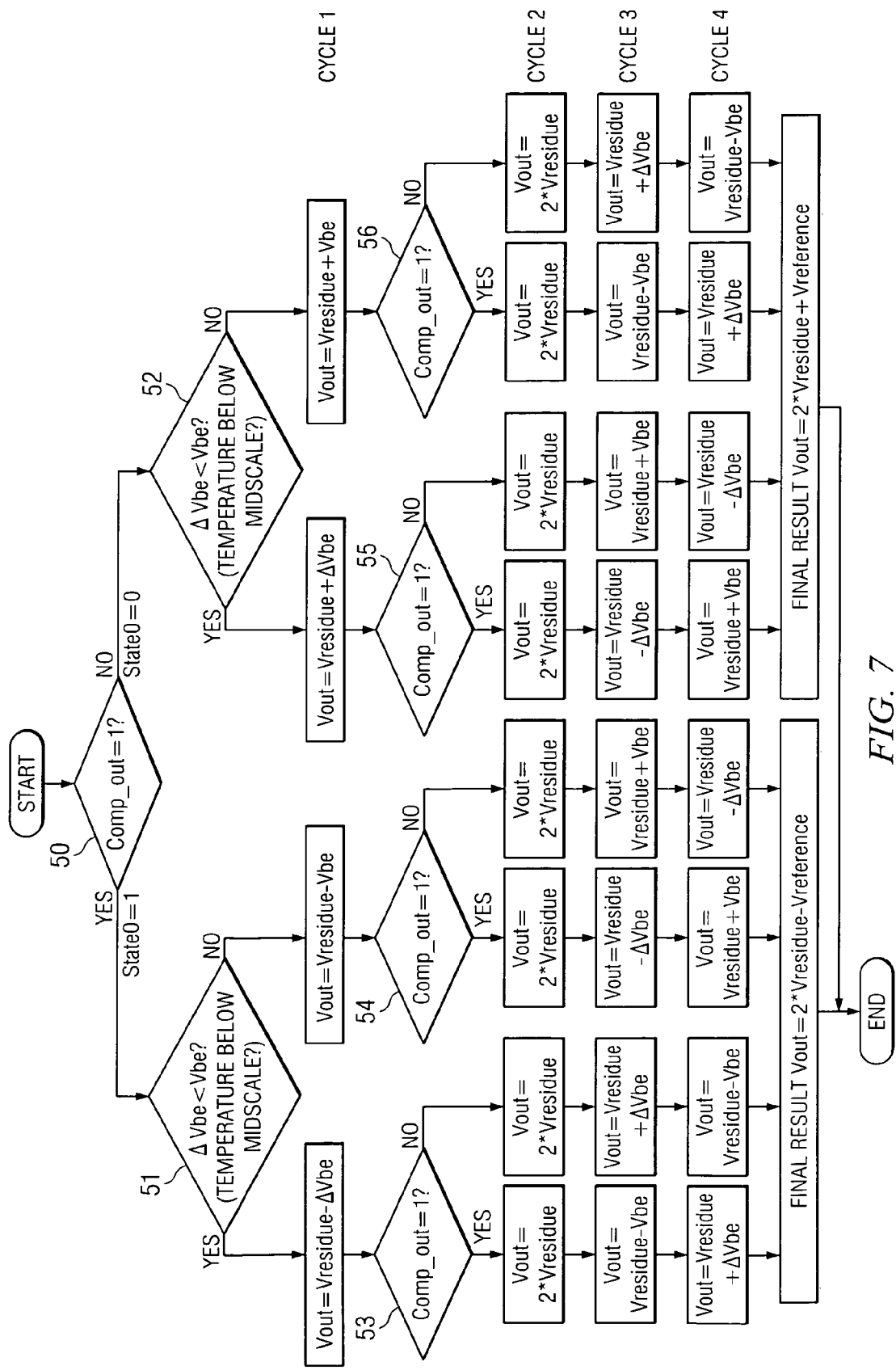
FIG. 7 is a flow diagram of the process also set forth in subsequently described Table 1.

If (Vresidue > 0) ("YES" in block 50 of FIG. 7) then
    If (Vbe > ΔVbe) ("YES" in decision block 51 of FIG. 7) then
        Vout1 = (Vresidue − ΔVbe)
    Else ("NO" in block 51 of FIG. 7)

-continued
```
        Vout1 = (Vresidue – Vbe)
    End If
    State0 = 1 ("YES" in block 50 of FIG. 7)
Else ("NO" in block 50)
    If (Vbe > ΔVbe) ("YES"in decision block 52 of FIG. 7) then
        Vout1 = (Vresidue + ΔVbe)
    Else ("NO" in block 52)
        Vout1 = (Vresidue + Vbe)
    End If
    State0 = 0 ("NO" in block 50 of FIG. 7)
End If
```

Cycle 1 operates to reduce the residue on the output Vout of integrator 30, i.e., to reduce the voltage swing of integrator output voltage Vout, before the multiplying by 2 of Cycle 2. If the integrator output voltage Vout from the previous integration is above 0 volts, the first integration will be in the negative direction, and if integrator output voltage Vout is less than 0 the first integration will be in the positive direction. Note that the output $V_{24}$ of comparator 22 in FIG. 6 is represented in FIG. 7 by "Comp_out". The comparator output just before Cycle 1 indicates whether the next previous integrator output voltage Vout was above or below zero, as indicated below in the first row of Table 1, and therefore indicates whether the integration will be in the positive direction or the negative direction. The decision whether to integrate Vbe or ΔVbe depends on which is larger. If the temperature is below the midscale (i.e., if Vbe>ΔVbe) integration starts with ΔVbe. The integration starts with Vbe if the temperature is above midscale (i.e., if Vbe<ΔVbe). However, in the case of a general ADC, integration can begin with either ΔVbe or Vbe.

Above mentioned State0 is a variable that is created to be used in the subsequent cycles. In State0, the state of the comparator output $V_{24}$ before Cycle 1 is recorded, to control entry into the SAR mode algorithm. The State 1 variable records the value of the comparator output voltage $V_{24}$ after Cycle 1, and that value is used to determine how to "complete" the SAR mode algorithm so as to obtain the correct Final Result expression at the bottom of Table 1.

Cycle 2:

```
If (Vresidue > 0) ("YES" in blocks 53 to 56 of FIG. 7) then
    State1 = 1
Else ("NO" in blocks 53 to 56 of FIG. 7)
    State1 = 0
End If
Vout2 = 2*(Vresidue)
```

Note that Vout1,2,3,4 are the values of Vout at the ends of Cycle1, 2, 3, 4, respectively.

In cycle 2 integrator 30 is configured for multiplication by 2. Current sources I0 and I1 are set to equal values, the unused input capacitors have zero differential voltages thereon, and multiplication by 2 is accomplished using only capacitors C3 and C2 (by means of switches SW3 and SW4). Vresidue is the previous value of the integrator output voltage Vout.

Cycle 3:

```
If (State0 = 1) ("YES" in block 50) then
    If (Vbe > ΔVbe) ("YES" in decision block 51 of FIG. 7) then
        If (State1 = 1) ("YES" in block 53 of FIG. 7) then
            Vout3 = (Vresidue – Vbe)
        Else ("NO" in block 53)
```

-continued
```
            Vout3 = (Vresidue + ΔVbe)
        End If
    Else ("NO" in block 51)
        If (State1 = 1) ("YES" in block 54) then
            Vout3 = (Vresidue –ΔVbe)
        Else ("NO" in block 54)
            Vout3 = (Vresidue + Vbe)
        End If
    End If
Else ("NO" in block 50)
    If (Vbe > ΔVbe) ("YES" in decision block 52 of FIG. 7) then
        If (State1 = 1) ("YES" in block 55) then
            Vout3 = (Vresidue – ΔVbe)
        Else ("NO" in block 55)
            Vout3 = (Vresidue + Vbe)
        End If
    Else ("NO" in block 52)
        If (State1 = 1) ("YES" in block 56) then
            Vout3 = (Vresidue – Vbe)
        Else ("NO" in block 56)
            Vout3 = (Vresidue + ΔVbe)
        End If
    End If
End If
```

Cycle 4:

```
If (State0 = 1) ("YES" in block 50) then
    If (Vbe > ΔVbe) ("YES" in decision block 51 of FIG. 7) then
        If (State1 = 1) ("YES" in block 53) then
            Vout4 = (Vresidue + ΔVbe)
        Else ("NO" in block 53)
            Vout4 = (Vresidue – Vbe)
        End If
    Else ("NO" in block 51)
        If (State1 = 1) ("YES" in block 54) then
            Vout4 = (Vresidue + Vbe)
        Else ("NO" in block 54)
            Vout4 = (Vresidue –ΔVbe)
        End If
    End If
Else ("NO" in block 50)
    If (Vbe > ΔVbe) ("YES" in decision block 52 of FIG. 7) then
        If (State1 = 1) ("YES" in block 55) then
            Vout4 = (Vresidue + Vbe)
        Else ("NO" in block 55)
            Vout4 = (Vresidue –ΔVbe)
        End If
    Else ("NO" in block 52)
        If (State1 = 1) ("YES" in block 56) then
            Vout4 = (Vresidue + ΔVbe)
        Else ("NO" in block 56)
            Vout4 = (Vresidue – Vbe)
        End If
    End If
End If
```

In the foregoing algorithm and in FIGS. 7, 8A, 8B and 9, Vresidue is the initial value of Vout at the beginning of Cycle1, and during Cycle2 Vresidue is Vout1, during Cycle 3 Vresidue is Vout2, and during Cycle4 Vresidue is Vout3. The value of Vresidue in the "FINAL RESULT" blocks at the bottoms of FIGS. 7, 8A, 8B and 9 is the initial value of Vout at the beginning of Cycle1. Vout1, Vout2, Vout3 and Vout4 in the foregoing algorithm are values of the integrator output Vout at the ends of Cycle1, Cycle2, Cycle3, and Cycle4, respectively.

It should be noted that the expression "Vbe>ΔVbe" in the foregoing algorithm is equivalent to the expression "Temperature<Midscale" if the input circuit 10 in FIG. 6 is used to generate Vbe=Vbe1=Vbe2 and also to generate ΔVbe=Vbe1−Vbe2.

Cycle 3 and Cycle 4 are integration cycles, in conventional delta-sigma integration mode, as needed to generate the Final Result expressions at the bottom of Table 1.

The foregoing values of Vout generated by the ends of Cycles 1,2,3,4 in algorithm are summarized in Table 1 below, and is also shown in the sequence of steps in the flow diagram of FIG. 7.

TABLE 1

| Cycle | Vresidue | Temperature Below Midscale (i.e., Vbe > ΔVbe) | | | | Temperature Above Midscale (i.e., Vbe < ΔVbe) | | | |
|---|---|---|---|---|---|---|---|---|---|
| | Before Cycle 1 | $V_{24}$ = '1' | | $V_{24}$ = '0' | | $V_{24}$ = '1' | | $V_{24}$ = '0' | |
| 1 | | −ΔVbe | −ΔVbe | +ΔVbe | +ΔVbe | −Vbe | −Vbe | +Vbe | +Vbe |
| | After Cycle 1 | $V_{24}$ = '0' | $V_{24}$ = '1' | $V_{24}$ = '0' | $V_{24}$ = '1' | $V_{24}$ = '0' | $V_{24}$ = '1' | $V_{24}$ = '0' | $V_{24}$ = '1' |
| 2 | | x2 | x2 | x2 | x2 | x2 | x2 | x2 | x2 |
| 3 | | +ΔVbe | −Vbe | +Vbe | −ΔVbe | +Vbe | −ΔVbe | +ΔVbe | −Vbe |
| 4 | | −Vbe | +ΔVbe | −ΔVbe | +Vbe | −ΔVbe | +Vbe | −Vbe | +ΔVbe |
| Final Result for integrator output Vout | | 2 * Vres − Vref | 2 * Vres − Vref | 2 * Vres + Vref | 2 * Vres + Vref | 2 * Vres − Vref | 2 * Vres − Vref | 2 * Vres + Vref | 2 * Vres + Vref |

The "Final Result" value of Vout of Cycles 1-4 is always 2*Vresidue+Vref when the initial value of Vresidue<0 and 2*Vresidue−Vref when the initial value of Vresidue>0, where the "entire reference voltage" Vref is equal to ΔVbe+Vbe. For example, if the comparator output $V_{24}$ is a "1" before Cycle 1, and ΔVbe is subtracted during Cycle 1, at this point the computation result in the SAR mode algorithm is Vresidue−ΔVbe. Then if comparator output $V_{24}$ switches to a "0" after Cycle 1, that term is multiplied by 2 during Cycle 2, and at that point the computation result is 2*Vresidue−2*ΔVbe. In that case, Table 1 and the flow diagram of FIG. 7 show that during Cycle 3 the term ΔVbe is added, so the computation result at that point is 2*Vresidue−ΔVbe. Finally, during Cycle 4 the term −Vbe is subtracted, so the final computation result for Vout is 2*Vresidue−ΔVbe−Vbe, which is equal to 2*Vresidue−Vref, as shown at the bottom of Table 1. The computation results for Vout for each of the possible combinations shown in the remaining columns of Table 1 can be readily determined in the foregoing manner. The "Final Result" is determined by the state of comparator output $V_{24}$ immediately before Cycle 1. If comparator output $V_{24}$ is a "1" before Cycle 1, the Final Result is always 2*Vresidue−Vref, and if the comparator output $V_{24}$ is a "0" before Cycle 1, the Final Result is always 2*Vresidue+Vref. An important aspect of the embodiment of the present invention shown in FIGS. 6 and 7 is to provide a way of obtaining the Final Result while keeping the integrator output voltage Vout sufficiently low to prevent saturation of operational amplifier 15. Another important aspect of the invention is to provide a way of creating a reference voltage when no dedicated reference voltage source is available.

In operation, either the present ΔVbe voltage or the present Vbe voltage is integrated by integrator 30 in either the positive (+) direction or the negative (−) direction. When comparator 22 changes state, the other of the present ΔVbe voltage and present Vbe voltage is integrated in the opposite direction. This has the effect of providing the "entire reference voltage" while limiting the swing of the integrator output voltage Vout.

In Cycle 2 of the foregoing SAR ADC algorithm (with reconfigurable circuit 310A configured for SAR ADC operation), the residue charge on the integrating capacitors C4 and C5 is multiplied by a factor of 2. This ordinarily would double the swing of integrator output voltage Vout, which is highly undesirable considering the desired objective of providing a self-contained, very small, very low cost, very accurate, very low power digital temperature sensor. After Cycle 2, a reference voltage needs to be added or subtracted, but the possibility of generating the entire reference voltage so it would exist as the sum of Vbe and ΔVbe and sampling that reference voltage with an adequate amount of sampling capacitance was considered unacceptable because the amount of required sampling capacitance require substantial increases in integrated circuit chip area and quiescent current.

However, in FIG. 6 the "entire reference voltage" does not exist at any one point in time and therefore does not result in an excessively large swing of integrator output voltage Vout. Instead, the process of generating each bit during SAR ADC mode operation is divided into 4 cycles during which relatively small separate parts of the entire reference voltage are integrated separately, resulting in lower swings of integrator output voltage Vout.

Using conventional delta-sigma integration techniques, the differential input voltage ΔVbe is integrated in either the (+) or (−) direction, i.e. is either added or subtracted, during Cycle 1. If, for example, the integration is in the (+) direction, and if the resulting integrator output voltage Vout is greater than zero volts, then during the next integration cycle, i.e., during Cycle 3, ΔVbe is integrated in the opposite direction, i.e. in the (−) direction. This maintains the resulting integrator output Vout closer to 0 volts.

It should be appreciated that increasing the capacitances of integrating capacitors C4 and C5 would decrease the swing of integrator output voltage Vout, but also would require physically larger integrating capacitors C4 and C5 only in the SAR mode. Use of larger integrating capacitors would also require increased quiescent current Iq in order to provide satisfactory integrating capacitor charging times and settling times during circuit operation. Increasing integrated circuit chip size and having increased quiescent current Iq during the entire analog-to-digital conversion cycle just because the voltage swing of integrator output voltage Vout is too high during the relatively few cycles of a SAR ADC operation would be inconsistent with the objective of providing a very small digital temperature sensor chip with the smallest possible power supply voltage and lowest possible quiescent current.

If during Cycle 1 the integration of ΔVbe in the (+) direction results in comparator output $V_{24}$ being equal to a "1", then later in Cycle 3 ΔVbe is integrated in the opposite or (−) direction, so as to maintain Vout within certain bounds. In the SAR mode, at the beginning of Cycle 2 the value of Vout, which represents an uncertain value of the residue of integrator 30, is to be amplified by a factor of 2 during Cycle 2 and this increases the swing of integrator output Vout by a factor of 2, but Vout nevertheless must be kept under the level at which integrator 30 saturates.

To accomplish this, the process for generating each bit of the SAR ADC conversion is separated into 4 cycles, referred to as Cycle 1, Cycle 2, Cycle 3 and Cycle 4. For SAR ADC operation, reconfigurable circuit 310A is configured so that Cycle 1 is an integration cycle in which conventional delta-sigma integration is performed, Cycle 2 multiplies the residue of the previous integration cycle by a factor of 2, and Cycles 3 and 4 include conventional delta-sigma integration. Each of Cycles 1-4 is divided into two half cycles, as previously described.

Figure 8A:
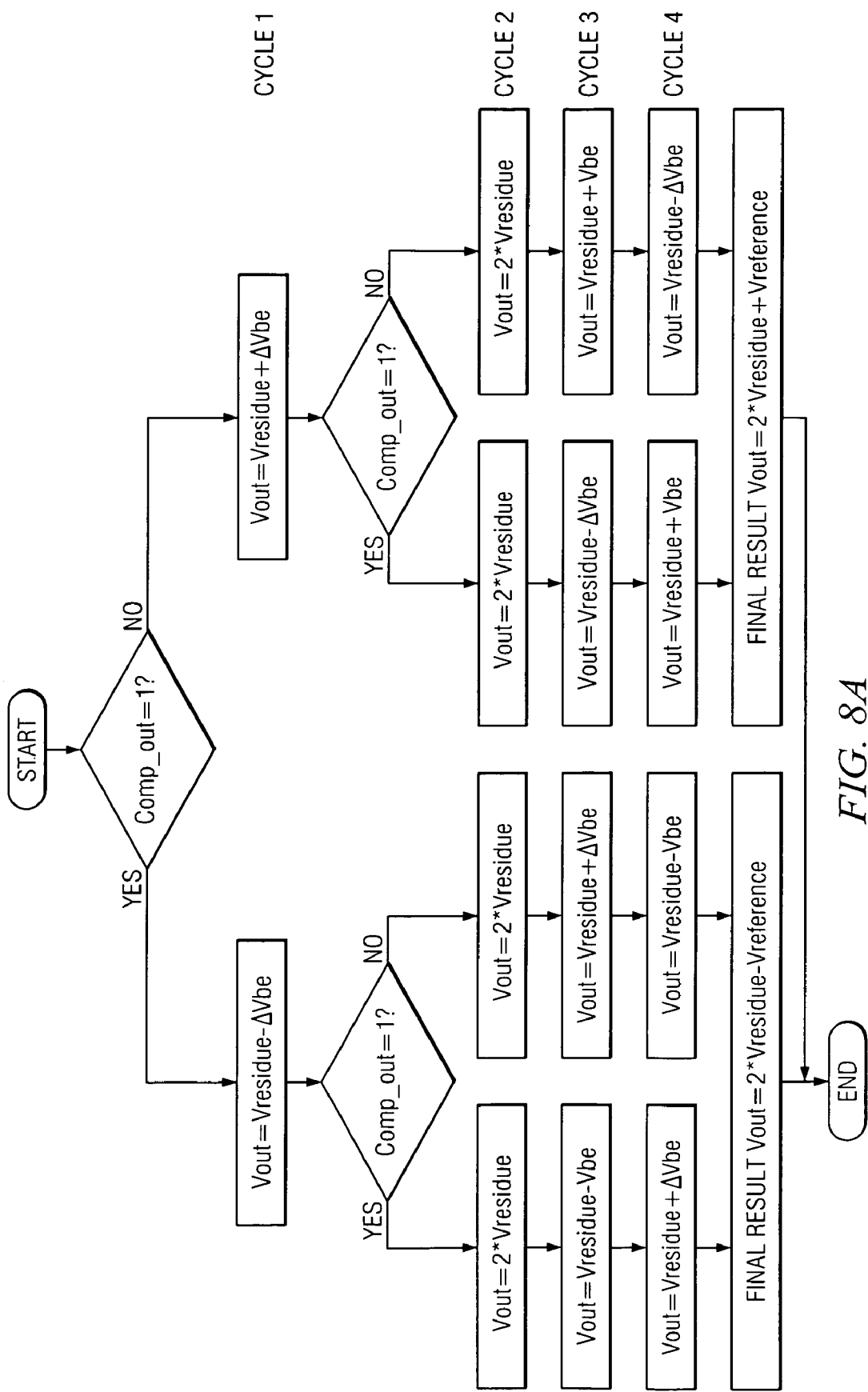
FIGS. 8A, 8B and 9 are flow diagrams of simplified versions of the process set forth in subsequently described Table 1.

The SAR mode algorithm can be performed in several ways, and in some cases can be simplified by using only the portion corresponding to the left half of Table 1, as indicated in the flow diagram of FIG. 8A. For example, referring to the left portion of Table 1 under the headings "Cycle", "Vresidue" and "Temperature Below Midscale", each SAR bit is produced by performing Cycles 1-4. Just before Cycle 1, the algorithm determines whether output $V_{24}$ of comparator 22 is a logical "0" or a logical "1". If the comparator output $V_{24}$ is equal to a logical "1", it is necessary to multiply Vresidue by 2 and subtract the "entire reference voltage" Vref, where Vref=$\Delta$Vbe+Vbe. If comparator output $V_{24}$ is equal to a logical "0", it is necessary to perform the multiplication 2*Vresidue and add Vref=$\Delta$Vbe+Vbe. If the comparator output $V_{24}$ is a logical "1", part of the "entire reference voltage" will be subtracted. In this case $\Delta$Vbe is subtracted. If the output Vout of integrator 30 is positive, since part of the "entire reference voltage" Vref is subtracted, integrator output Vout will decrease to 0 volts or a negative voltage. If comparator output $V_{24}$ is a logical "0", integrator output Vout is negative, and $\Delta$Vbe will be added. Then the integrator output Vout goes from a negative value closer to zero or to a positive voltage.

Thus, the purpose of Cycle 1 is to bring the differential integrator output voltage Vout closer to 0 volts, i.e., to limit the voltage swings of the integrator output voltage Vout. The third row of Table 1, labeled "After Cycle 1", indicates the comparator output voltage $V_{24}$ that occurs as the result of performing Cycle 1.

During Cycle 2 of the SAR mode algorithm, a multiplication by 2 is performed, so the circuit in FIG. 6 is configured by digital control circuit 28 to operate in SAR ADC conversion mode. That is, switches SW3 and SW4 are connected to the (+) and (−) outputs, respectively, of operational amplifier 15 so that capacitors C3 and C2 provide positive feedback in integrator 30.

After the residue of integrator 30 is multiplied by 2 in Cycle 2, then Cycle 3 is performed using the values of comparator output $V_{24}$ after Cycle 1. If the $V_{24}$ result is positive, i.e., is a "1, a negative integration is performed to maintain the differential integrator output Vout closer to 0 volts, or if the $V_{24}$ result is negative, i.e., is a "zero", a positive integration is performed to maintain Vout closer to 0 volts.

Figure 8B:
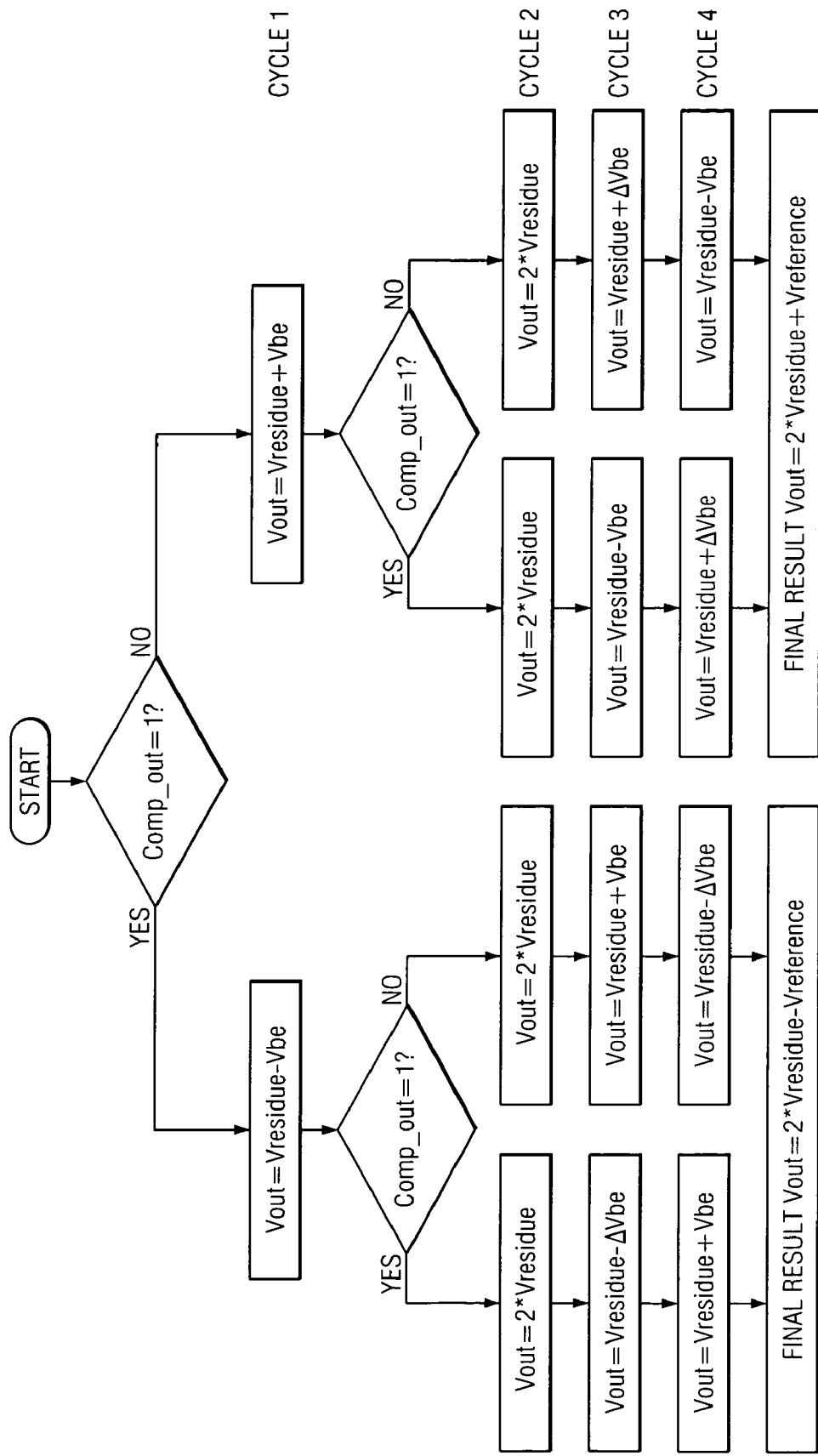

The flow diagram of FIG. 8B applies to the simplification wherein only the portion of the algorithm indicated in the right half of Table 1 is used. Referring to the right part of Table 1, if before Cycle 1 the comparator output $V_{24}$ was a logical "1", then during Cycle 1, −Vbe was integrated, and then was multiplied by 2 during Cycle 2. If the comparator output result $V_{24}$ after Cycle 1 was a logical "0", then Vbe is added, i.e., a positive integration was performed. If the comparator output result $V_{24}$ after Cycle 1 was a "1", because the differential integrator output Vout was positive, then $\Delta$Vbe is subtracted, i.e., integrated in the negative direction.

Then, during Cycle 3 and Cycle 4, the steps needed to produce to the "Final Result" expression in the bottom row of Table 1 are performed. If $\Delta$Vbe, was previously added, then Vbe is subtracted during Cycle 4, and vice versa.

Dividing the SAR ADC bit generating process into the 4 cycles of the SAR mode algorithm avoids the need to add (i.e., to integrate in the (+) direction) or subtract (i.e., to integrate in the (−) direction) the entire reference voltage Vref as required by the prior art, and thereby avoids the large swing of integrator output voltage Vout that would occur from integrating the entire reference voltage, and also avoids the need to provide the reference voltage as a unitary voltage from a single voltage source.

Figure 9:
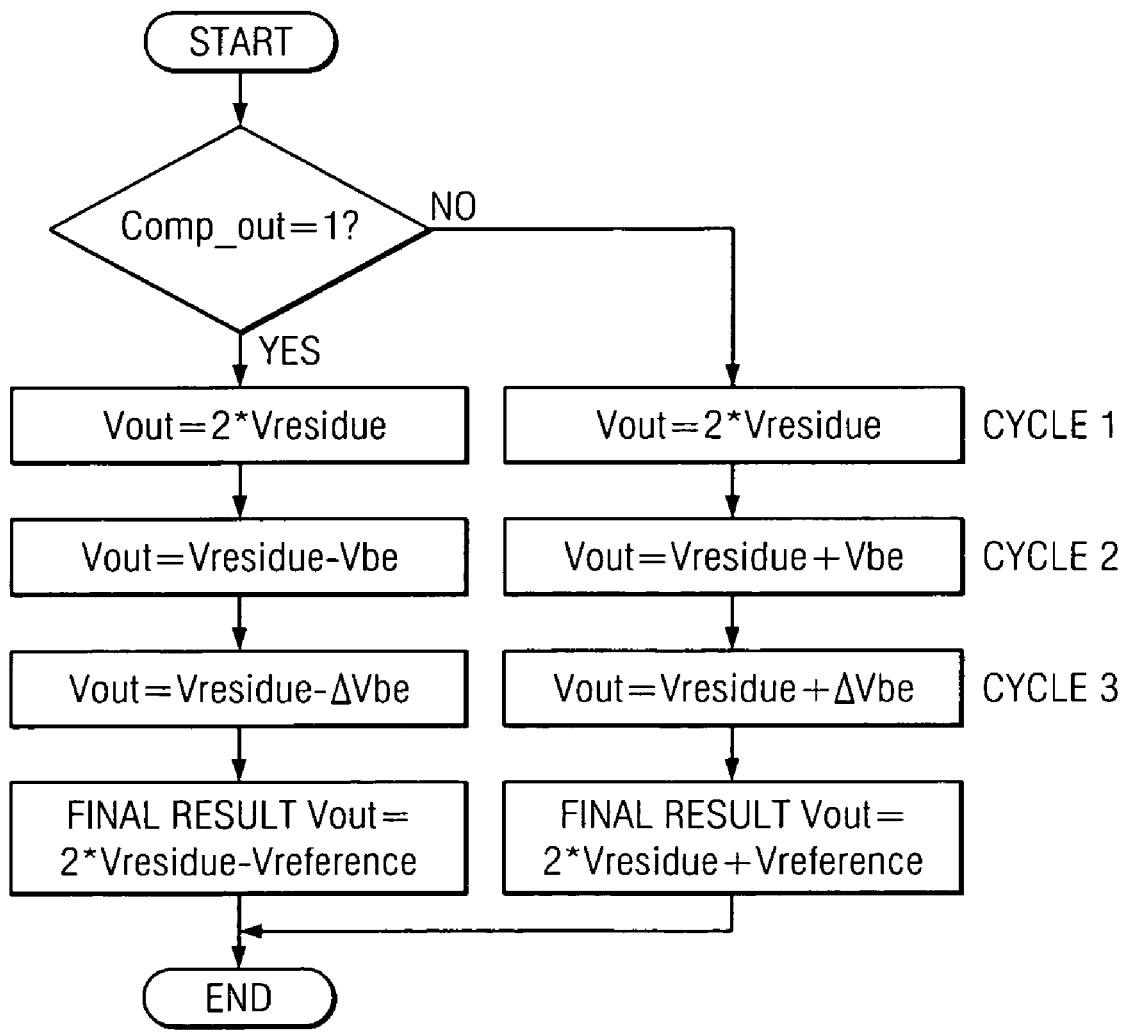

It should be understood that the SAR mode algorithm can be constructed in other ways. For example, Cycle 1 in Table 1 could be omitted in a modified SAR mode algorithm if there is no need to limit the voltage swing of integrator output Vout. The flow diagram of FIG. 9 sets forth the process for this simplified case. Cycle 2 in Table 1, which multiplies Vresidue by 2, is the first cycle of the modified SAR mode algorithm of FIG. 9. That could be followed by a second cycle similar to Cycle 3 in Table 1 and a third cycle similar to Cycle 4 in Table 1, so as to produce the same Final Result for integrator output Vout as shown at the bottom of Table 1. The second and third cycles of the modified SAR mode algorithm of FIG. 9 would include adding or subtracting $\Delta$Vbe and adding or subtracting Vbe, so as to produce the required Final Result expressions shown in Table 1. The problem of this three-cycle technique of FIG. 9 is that for Cycle 1, Vresidue must be multiplied by a factor of 2, and this results in a substantial increase of the output voltage swing Vout of integrator 30. The above described SAR mode algorithm as shown in Table 1 avoids this problem. However, the foregoing modified three-cycle SAR mode algorithm is suitable for the purpose of generating a needed reference voltage in a circuit which does not include other circuitry for generating the reference voltage, if integrator 30 does not saturate an unacceptable amount.

For a temperature sensor including an analog input stage 13 as shown in FIG. 6 that inherently converts ambient temperature to a corresponding differential analog voltage $\Delta$Vbe, when it is known at the outset whether the ambient temperature is above or below a particular midpoint, the algorithm can include both the left and right portions of Table 1. The ambient temperature at the beginning of the above described SAR mode algorithm is known because almost the entire digital output result (i.e., all of the MSB bits) of the overall analog-to-digital conversion has already been produced during the delta-sigma analog-to-digital conversion. Therefore, all that remains to be done is to generate some more LSB bits in order to obtain higher digital resolution of the final conversion result.

The main advantages of ADC 400 of FIG. 3A when it is modified in accordance with the present invention by replacing reconfigurable circuit 310 with reconfigurable circuit 10 of FIG. 6, are that reconfigurable circuit 10 samples Vbe and $\Delta$Vbe of FIG. 6 rather than ±Vref of FIG. 3A and nevertheless uses the same basic mode of combining delta-sigma ADC operation to generate the MSB bits and SAR ADC operation to generate the LSB bits of the final conversion result. Very little additional hardware is required to provide a very accurate, very low power, low supply voltage self-contained temperature sensor. Furthermore, the multiplication by 2 in the foregoing SAR ADC algorithm is performed in a separate cycle (i.e., Cycle 2), so the same capacitors which are used to sample the $\Delta$Vbe input can also be used for the multiplication by 2 function. The SAR mode algorithm monitors the integrator output voltage Vout and keeps integrator 30 out of saturation. This allows reconfigurable circuit 310A of FIG. 6 in ADC circuit 400 in FIG. 3A to operate with a reduced value of available integrator output voltage swing, and accordingly allows use of a lower minimum power supply voltage. The re-utilizing of the various capacitors for various functions as described above allows the size and quiescent current of the integrated circuit chip to be substantially reduced. The reconfigurable circuit 10 of FIG. 6 also requires a relatively low number of switching modes and thereby allows high conversion accuracy and low noise even when the ADC is fabricated using a "leaky" low voltage integrated circuit manufacturing process. The architecture, shown in FIG. 6 when applied to input conductors 11 and 12 of integrator 30, can be used in a general-purpose analog-to-digital converter, and is not limited to use in a temperature sensor. In a general-purpose analog-to-digital converter, the Vin+ and Vin− inputs would be applied to separate capacitors as shown in FIG. 3A. Input conductors 11 and 12 of the integrator 30 provide the two parts of the reference voltage Vref equal to Vbe+ΔVbe.

An important difference between the present invention and the hybrid integrating/delta-sigma ADC architecture of above mentioned patent application Ser. No. 11/738,566 (also described herein with reference to FIGS. 1-5) is that multiple cycles, i.e., Cycles 1-4, are performed for each SAR bit generated, so as to perform the foregoing four-cycle SAR mode algorithm with minimum hardware, minimum output voltage swing, and sampling of the voltage reference in "pieces". Thus, it is possible to implement the hybrid or mixed delta-sigma/SAR ADC as shown in FIG. 3A for low voltage operation without using a single entire reference voltage Vref and only the additional hardware including switches SW3 and SW4, without requiring additional circuitry, larger capacitor sizes, additional integrated circuit chip area, without additional quiescent current Iq. The effective value of the entire reference voltage Vref can be greater than the value of the power supply voltage.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the order of occurrence of Cycle2 and Cycle3 in FIG. 9 can be reversed. Transistors MN0 and MN1 could be PNP transistors or ordinary diodes.

What is claimed is:

1. Reconfigurable circuitry in a hybrid delta-sigma/SAR ADC (analog-to-digital) circuit for converting an input voltage to a digital result, the reconfigurable circuitry comprising:
   an integrator including:
      an amplifier;
      a plurality of input capacitors and first and second integrating capacitors; and
      a plurality of switches for selectively coupling the plurality of input capacitors and the first and second integrating capacitors between various terminals of the amplifier and input terminals of the integrator to effectuate operation of the hybrid delta-sigma/SAR ADC in delta-sigma ADC and SAR ADC modes thereof;
   a comparator having an input coupled to an output of the integrator, an output of the comparator being coupled to MSB/LSB combination logic of the hybrid delta-sigma/SAR ADC circuit;
   digital control circuitry coupled to control electrodes of the plurality of switches for controlling the plurality of switches by performing a plurality of cycles of SAR ADC operation for generating each of one or a plurality of SAR bits; and
   the digital control circuitry creating an entire reference voltage value equal to the sum of a first voltage and a second voltage, a first cycle including multiplying a residue voltage of the integrator by 2, a second cycle integrating the second voltage in a first direction by means of the integrator if the comparator changes state or in a second direction opposite to the first direction if the comparator does not change state, and a third cycle integrating the first voltage in a direction that causes the integrator output voltage to equal either 2×Vresidue−Vref or 2×Vresidue+Vref, wherein Vresidue is a residue voltage which is an output voltage of the integrator at the end of a preceding cycle and Vref is equal to the entire reference voltage value.

2. The reconfigurable circuitry of claim 1 wherein the first voltage is the input voltage.

3. The reconfigurable circuitry of claim 2 wherein the first voltage is a PTAT (proportional to absolute temperature) voltage and the second voltage is inversely proportional to temperature.

4. The reconfigurable circuitry of claim 2 wherein the digital control circuitry performs a fourth cycle before the first, second and third cycles, the fourth cycle including integrating a value of the input voltage in a second direction by means of the integrator so as to substantially reduce a voltage swing of the output of the integrator.

5. The reconfigurable circuitry of claim 1 wherein the second cycle is performed after the first cycle and the third cycle is performed after the second cycle.

6. The reconfigurable circuitry of claim 1 wherein the third cycle is performed before the second cycle.

7. The reconfigurable circuitry of claim 1 wherein the amplifier is a differential operational amplifier.

8. The reconfigurable circuitry of claim 1 wherein each of the plurality of switches includes a single pole, double throw switch circuit.

9. The reconfigurable circuitry of claim 8 wherein each of the plurality of switches is controlled by the digital control circuitry.

10. The reconfigurable circuitry of claim 4 wherein each of the plurality of switches is controlled by the digital control circuitry and wherein the digital control circuitry executes an algorithm represented by Cycle 1:

```
If (Vresidue > 0) then
    If (Vbe > ΔVbe) then
        Vout1 = (Vresidue − ΔVbe)
    Else
        Vout1 = (Vresidue − Vbe)
    End If
    State0 = 1
Else
    If (Vbe > ΔVbe) then
        Vout1 = (Vresidue + ΔVbe)
    Else
        Vout1 = (Vresidue + Vbe)
    End If
    State0 = 0
End If
```

Cycle 2:

```
If (Vresidue > 0) then
        State1= 1
Else
        State1 = 0
End If
Vout2 = 2*(Vresidue)
```

Cycle 3:

```
If (State0 = 1) then
    If (Vbe > ΔVbe) then
        If (State1= 1) then
            Vout3 = (Vresidue – Vbe)
        Else
            Vout3 = (Vresidue + ΔVbe)
        End If
    Else
        If (State1= 1) then
            Vout3 = (Vresidue –ΔVbe)
        Else
            Vout3 = (Vresidue + Vbe)
        End If
    End If
Else
    If (Vbe > ΔVbe) then
        If (State1= 1) then
            Vout3 = (Vresidue – ΔVbe)
        Else
            Vout3 = (Vresidue + Vbe)
        End If
    Else
        If (State1= 1) then
            Vout3 = (Vresidue – Vbe)
        Else
            Vout3 = (Vresidue + ΔVbe)
        End If
    End If
End If
```

Cycle 4:

```
If (State0 = 1) then
    If (Vbe > ΔVbe) then
        If (State1= 1) then
            Vout4 = (Vresidue + ΔVbe)
        Else
            Vout4 = (Vresidue – Vbe)
        End If
    Else
        If (State1= 1) then
            Vout4 = (Vresidue + Vbe)
        Else
            Vout4 = (Vresidue –ΔVbe)
        End If
    End If
Else
    If (Vbe > ΔVbe) then
        If (State1= 1) then
            Vout4 = (Vresidue + Vbe)
        Else
            Vout4 = (Vresidue – ΔVbe)
        End If
    Else
        If (State1= 1) then
            Vout4 = (Vresidue + ΔVbe)
        Else
            Vout4 = (Vresidue – Vbe)
        End If
    End If
End If,
``` wherein Vresidue is a residue voltage which is an output voltage of the integrator at the end of a preceding cycle, ΔVbe is the first voltage, Vout1, Vout2, Vout3, and Vout4 are the values of the output of the integrator at ends of the fourth, first, second, and third cycles, respectively, Vbe is the second voltage, and Vref is the entire reference voltage value.

11. The reconfigurable circuitry of claim 1 wherein the integrator includes first, second, third, fourth, fifth, and sixth input capacitors, the first and second integrating capacitors, and first, second, third, fourth, fifth and sixth switches, wherein the first input capacitor is connected between a first conductor and a pole of the first switch, the second input capacitor is connected between a second conductor and a pole of the second switch, the third input capacitor is connected between the second conductor and a pole of the fourth switch, the fourth input capacitor is connected between the first conductor and a pole of the third switch, the first conductor is coupled to a pole of the fifth switch and a non-inverting input of the amplifier, the second conductor is connected to a pole of the sixth switch and an inverting input of the amplifier, the first integrating capacitor is connected between a first terminal of the fifth switch and a third conductor, the second integrating capacitor is connected between a first terminal of the sixth switch and a fourth conductor, the third conductor is connected to a second terminal of the fifth switch, an inverting output of the amplifier, an inverting input of the comparator, and a first terminal of the fourth switch, the fourth conductor is connected to a second terminal of the sixth switch, a non-inverting output of the amplifier, a non-inverting input of the comparator, and a first terminal of the third switch, a first terminal of the first switch is connected to a first input conductor, a second terminal of the first switch is connected to a supply voltage, a first terminal of the second switch is connected to a second input conductor, a second terminal of the second switch is connected to the supply voltage, the fifth input capacitor is connected between the second conductor and the second input conductor, the sixth input capacitor is connected between the first conductor and the first input conductor, the first input conductor is connected to a second terminal of the third switch, and the second input conductor is connected to a second terminal of the fourth switch.

12. The reconfigurable circuitry of claim 2 wherein the input voltage is produced by an input circuit including first and second transistors and first and second variable current sources so as to cause the input voltage to represent a temperature of the first and second transistors, the first transistor having an emitter connected to a supply voltage and a base and collector connected by a first input conductor to the first variable current source, the second transistor having an emitter connected to the supply voltage and a base and collector connected by a second input conductor to the second variable current source, the input voltage being applied between the first and second input conductors.

13. The reconfigurable circuitry of claim 12 wherein the digital circuitry controls values of currents produced by the first and second variable current sources, respectively, so as to establish a desired amplitude of the second voltage and a desired amplitude and polarity of the input voltage.

14. The reconfigurable circuitry of claim 10 wherein the algorithm limits an amplitude of the output voltage produced by the integrator to thereby allow accurate operation of the reconfigurable circuitry with a low power supply voltage.

15. The reconfigurable circuitry of claim 13 wherein the reconfigurable circuitry and the hybrid delta-sigma/SAR ADC are configured to provide a digital temperature sensor in a single integrated circuit chip.

16. A method of operating reconfigurable circuitry in a hybrid delta-sigma/SAR ADC (analog-to-digital converter), the reconfigurable circuitry including an integrator including an amplifier, a plurality of input capacitors, first and second integrating capacitors, a plurality of switches for selectively coupling the plurality of input capacitors and the first and second integrating capacitors to various terminals of the amplifier and input terminals of the integrator to effectuate operation of the hybrid delta-sigma/SAR ADC in delta-sigma ADC and SAR ADC modes thereof, and a comparator coupled to an output voltage of the integrator, the method comprising:

controlling the plurality of switches by performing a plurality of cycles of SAR operation of the hybrid delta-sigma/SAR ADC for generating each of a plurality of SAR bits, the controlling in effect creating an entire reference voltage value equal to the sum of a first voltage and a second voltage;

performing a first cycle by multiplying a residue voltage of the integrator by 2;

performing a second cycle by integrating the second voltage in a first direction by means of the integrator if the comparator changes state or in a second direction opposite to the first direction if the comparator does not change state; and performing a third cycle by integrating the first voltage in a direction that causes the output voltage of the integrator to equal either 2×Vresidue−Vref or 2×Vresidue+Vref, wherein Vresidue is a residue voltage which is an output voltage of the integrator at the end of a preceding cycle and Vref is equal to the entire reference voltage value.

17. The method of claim 16 wherein the first voltage is an input voltage of the hybrid delta-sigma/SAR ADC.

18. The method of claim 17 including performing a fourth cycle before the first, second and third cycles, the fourth cycle including integrating a value of the input voltage in a second direction by means of the integrator so as to substantially reduce a voltage swing of the output voltage of the integrator.

19. The method of claim 15 including producing the input voltage by controlling amounts of current through first and second diode-connected transistors so as to produce the input voltage as a difference between base-emitter junction voltages of the first and second diode-connected transistors representing a temperature of the first and second diode-connected transistors.

20. The method of claim 19 including controlling values of the currents through the first and second diode-connected transistors so as to establish a desired amplitude of the second voltage and a desired amplitude and polarity of the input voltage.

21. Reconfigurable circuitry in a hybrid delta-sigma/SAR ADC (analog-to-digital converter), comprising:

integrating means including an amplifier, a plurality of input capacitors, first and second integrating capacitors, a plurality of switches for selectively coupling the plurality of input capacitors and the first and second integrating capacitors to various terminals of the amplifier and input terminals of the integrator to effectuate operation of the hybrid delta-sigma/SAR ADC in delta-sigma ADC and SAR ADC modes thereof, and a comparator coupled to an output voltage of the integrator;

means for controlling the plurality of switches by performing a plurality of cycles of SAR operation of the hybrid delta-sigma/SAR ADC for generating each of a plurality of SAR bits, the controlling in effect creating an entire reference voltage value equal to the sum of a first voltage and a second voltage;

means for performing a first cycle by multiplying a residue voltage of the integrator by 2;

means for performing a second cycle by integrating the second voltage in a first direction by means of the integrator if the comparator changes state or in a second direction opposite to the first direction if the comparator does not change state; and means for performing a third cycle by integrating the input voltage in a direction that causes the output voltage of the integrator to equal either 2×Vresidue−Vref or 2×Vresidue+Vref, wherein Vresidue is a residue voltage which is an output voltage of the integrator at the end of a preceding cycle and Vref is equal to the entire reference voltage value.

* * * * *